(12) United States Patent
Liu et al.

(10) Patent No.: US 9,953,847 B2
(45) Date of Patent: Apr. 24, 2018

(54) APPARATUS AND METHOD FOR CLEANING

(71) Applicant: TAIWAN SEMICONDUCTOR MANUFACTURING COMPANY LTD., Hsinchu (TW)

(72) Inventors: Ping-Yin Liu, Taipei County (TW); Xin-Hua Huang, Changhua County (TW); Lan-Lin Chao, Taipei County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 868 days.

(21) Appl. No.: 14/023,099

(22) Filed: Sep. 10, 2013

(65) Prior Publication Data

US 2015/0068552 A1    Mar. 12, 2015

(51) Int. Cl.
*H01L 21/67* (2006.01)

(52) U.S. Cl.
CPC .. *H01L 21/67046* (2013.01); *H01L 21/67051* (2013.01); *H01L 21/67057* (2013.01)

(58) Field of Classification Search
CPC ......... H01L 21/67046; H01L 21/67051; H01L 21/67057

USPC .......................................................... 134/184
See application file for complete search history.

(56) References Cited

U.S. PATENT DOCUMENTS

| | | | | |
|---|---|---|---|---|
| 2004/0088880 A1* | 5/2004 | Yang | ................. | H01L 21/67034 34/467 |
| 2005/0003737 A1* | 1/2005 | Montierth | .............. | A61B 8/546 451/5 |
| 2008/0271747 A1* | 11/2008 | De Jong | ................... | B08B 3/12 134/1 |
| 2009/0180086 A1* | 7/2009 | Ryu | ........................ | B08B 1/007 355/30 |
| 2010/0147336 A1* | 6/2010 | Obweger | .......... | H01L 21/67051 134/34 |
| 2010/0192974 A1* | 8/2010 | Matsumoto | ............... | B08B 3/02 134/1.3 |

* cited by examiner

*Primary Examiner* — Michael E Barr
*Assistant Examiner* — Tinsae B Ayalew
(74) *Attorney, Agent, or Firm* — WPAT, P.C., Intellectual Property Attorneys; Anthony King

(57) ABSTRACT

A semiconductor structure includes a molding compound, a conductive plug, and a cover. The conductive plug is in the molding compound. The cover is over a top meeting joint between the conductive plug and the molding compound. The semiconductor structure further has a dielectric. The dielectric is on the cover and the molding compound.

17 Claims, 26 Drawing Sheets

APPARATUS AND METHOD FOR CLEANING

FIELD

The disclosure relates to an apparatus and a method for cleaning a plate, and more particularly to a cleaning system for cleaning a plate designed for cleaning a wafer surface.

BACKGROUND

Wafer level packaging (WLP) technology combines dies having different functionalities at a wafer level, and is widely applied in order to meet continuous demands toward the miniaturization and higher functions of electronic components. The WLP technology includes few operations, such as bonding two different wafers into an integral part (called wafer bonding hereinafter) and then proceeding to a sigulation process to cut the integral part into a singulated package.

Fusion bonds and hybrid bonds are two terms generally used to categorize various wafer bonding methods. A fusion bond refers to a wafer bonding method in which there is only dielectric material involved on the bonding surface. The hybrid bond, on the other hand, refers a wafer bonding method in which has a dielectric and a metallic material contained on the bonding surface. The hybrid bond is more complicated than the fusion bond because it includes two different materials. In some examples such as CMOS image sensor (CIS) wafer bonding, a bonded interface includes copper and silicon oxide.

The wafer bonding is based on chemical bonds between two surfaces of any materials that meet numerous requirements specified for the wafer surface. As such, the wafer surface must be clean. Otherwise, unbonded areas called voids, i.e. interface bubbles, can occur. However, during a wafer bonding process, cleanness of a wafer surface is a challenge and affected by some factors, such as cross contamination or clean tool deviation. Thus, a system or a method to provide a clean wafer surface is still in great demand.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

A more complete understanding of the present disclosure may be derived by referring to the detailed description and claims when considered in connection with the Figures, where like reference numbers refer to similar elements throughout the Figures, and:

DETAILED DESCRIPTION OF THE INVENTION

Figure 1:
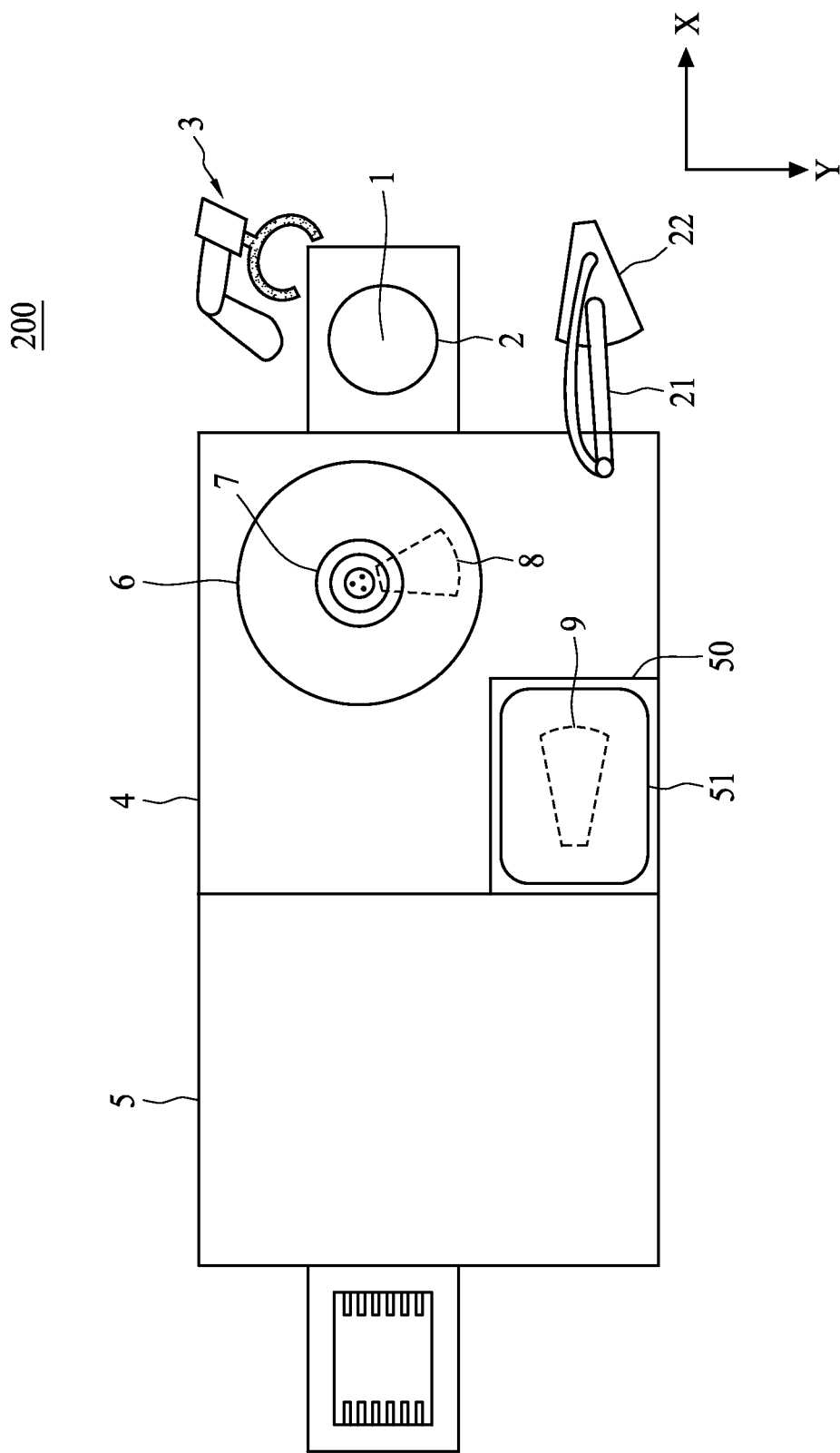
FIG. 1 is a schematic view of a semiconductor wafer cleaning system for cleaning a plate designed for cleaning a wafer surface.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter.

In the present disclosure, an apparatus is designed to clean a plate that is used to clean a surface of a wafer. The plate is constantly cleaned with the apparatus in order to keep the plate in an optimized condition, such as without any particle or other contamination sources attached.

In various embodiments, the plate and the apparatus are in a system and the system is used to clean a surface of a wafer before the wafer is bonded to another wafer. In some embodiments, the plate in system is designed to clean a batch of wafers continuously and the apparatus built in the system is designed to clean the plate with a predetermined interval. Thus, the plate does not cause the cross contamination on the wafers.

FIG. 1 is a semiconductor wafer cleaning system 200 designed to clean a top surface 1 of a semiconductor wafer 2. In various embodiments, the semiconductor wafer 2 includes CIS devices and the top surface 1 includes oxide and metal. In some embodiments, the metal includes copper. The semiconductor wafer 2 is directly bonded with another wafer after cleaned by the semiconductor wafer cleaning system 200. In some embodiments, the semiconductor wafer cleaning system 200 is connected with a loader 3 and the loader 3 is designed to send wafers continuously into the semiconductor wafer cleaning system 200. In some embodiments as in FIG. 1, the semiconductor wafer cleaning system 200 has several chambers, such as 4 and 5 and the semiconductor wafer 2 travels through the chambers 4 and 5 to receive a complete clean operation. A first chamber 4 is a wafer clean station in which the top surface 1 of the semiconductor wafer 2 is cleaned when the semiconductor wafer 2 is located inside the first chamber 4. In addition, semiconductor wafer cleaning system 200 includes a cup 6, a clean unit 50, a plate 22 and an arm 21 connecting to the plate 22 in the first chamber 4. A wafer chuck 7 is inside the cup 6 and a container 51 is disposed inside the clean unit 50.

The first chamber 4 includes the cup 6 designed for accommodating the semiconductor wafer 2 and draining a clean liquid, which is used to clean the semiconductor wafer 2. The wafer chuck 7 is designed for holding the semiconductor wafer 2 on the wafer chuck 7 for further spinning motion. In some embodiments, the wafer chuck 7 applies vacuum to the bottom surface of the semiconductor wafer 2 so as to hold the semiconductor wafer 2 on the wafer chuck 7 in a rotation (from about 500 to about 5000 rpm). In addition, the second chamber 5 is designed for other wafer processes, such as drying wafer bonding and so on.

The plate 22 is used to clean the top surface 1 of the semiconductor wafer 2. In some embodiments, the semiconductor wafer cleaning system 200 is designed to be able to operate under a first mode and a second mode. Under the first mode, the plate 22 is at a first position 8. Under the second mode, the plate 22 is at a second position 9. In some embodiments, the first mode is a run mode, which indicates that the semiconductor wafer 2 is in the first chamber 4 and cleaned by the plate 22. The second mode is a self-clean mode, which indicates that the plate 22 is cleaned in a clean unit 50.

Figure 2:
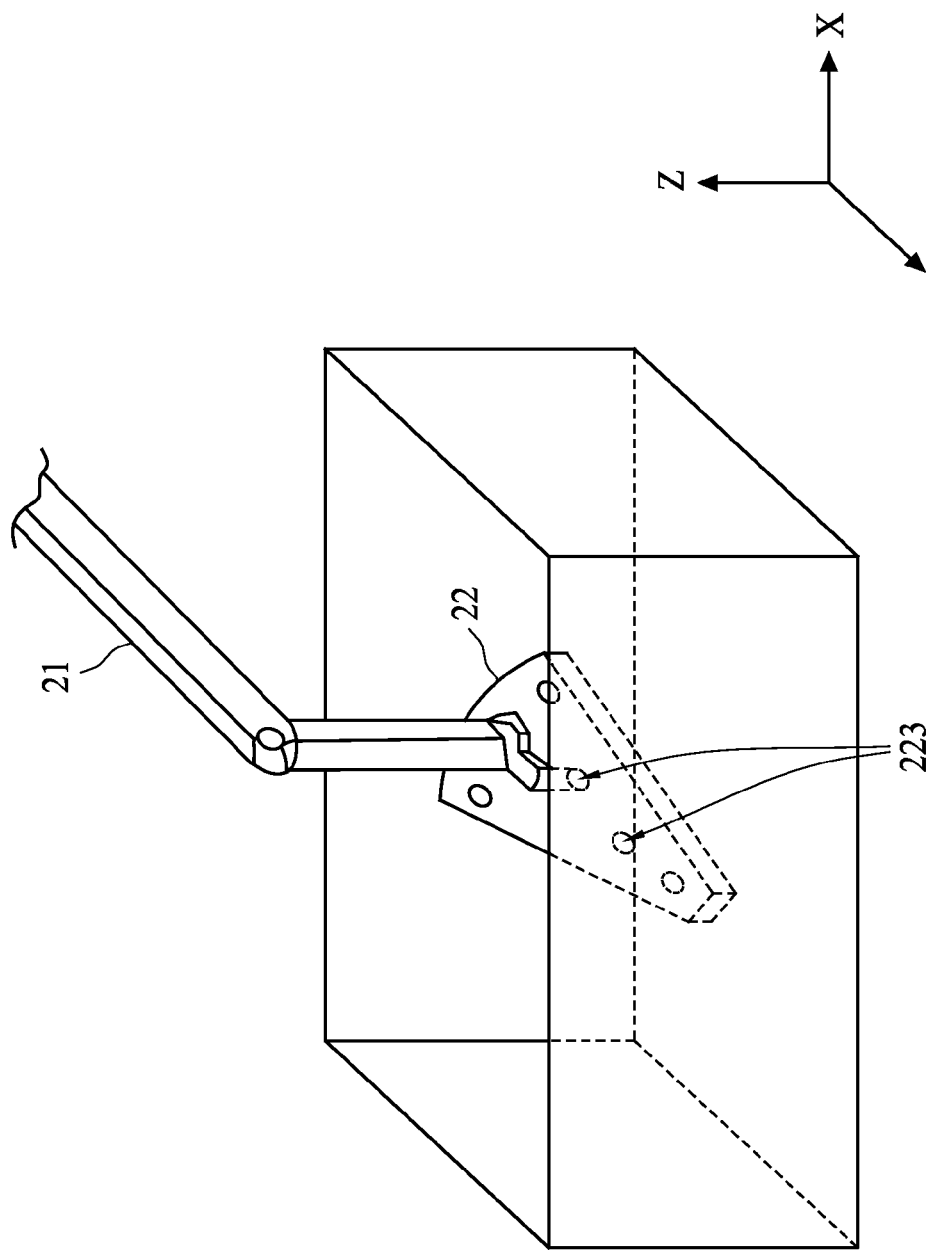
FIG. 2 is a schematic view of a plate and an arm connecting with the plate, which moves along X, Y, or Z direction.

The arm 21 designed to control the position of the plate 22, which is pivoted to an arm 21. In some embodiments, the arm 21 conducts a three-dimensional motion. FIG. 2 is an enlarged view of the arm 21 and the plate 22. The arm 21 moves the plate 22 along X, Y, or Z direction. In some embodiments, the plate 22 is swiveled by the arm 21, for example the plate 22 is moved from the first position 8 to the second position 9 as previously discussed with reference to FIG. 1.

In some embodiments as in FIG. 2, the plate 22 is in a pie shape that is designed for cleaning a great amount of the wafer surface per timeframe. However, in certain embodiments, the plate 22 is in, but not limited to, a triangular shape, a square shape, a quadrilateral shape, or a polygonal shape. Other shapes are within the contemplated scope of the present disclosure.

Figure 3:
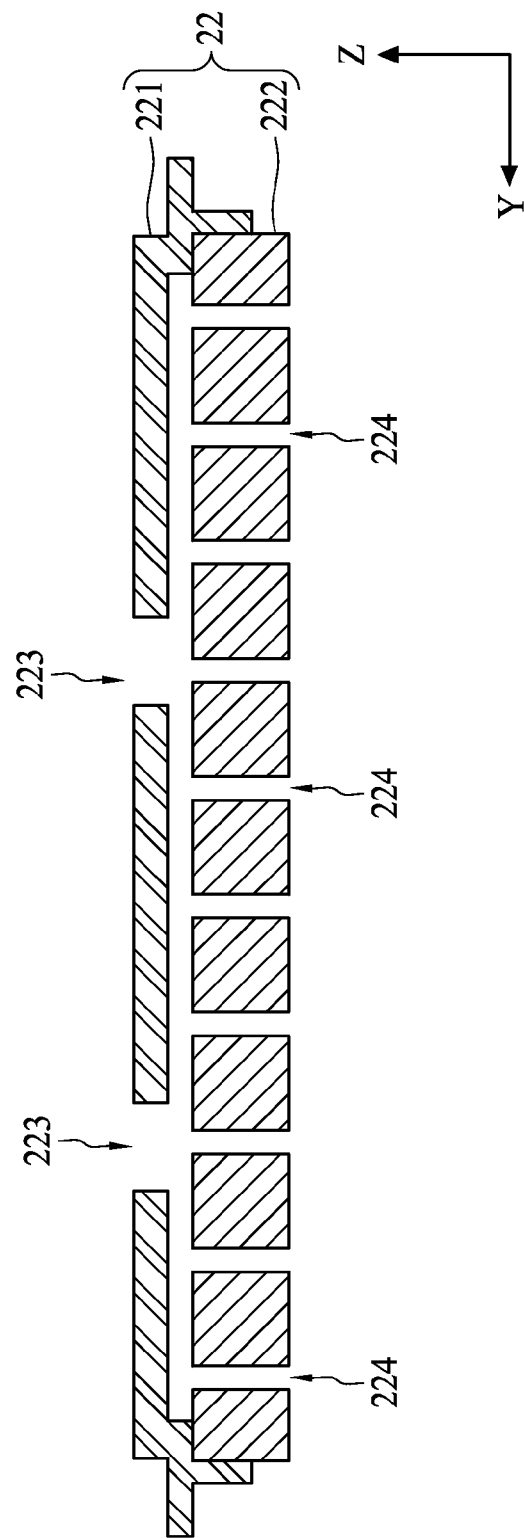
FIG. 3 is a cross-sectional view of a plate, which includes two layers. The top layer is designed to guide the liquid toward the bottom layer.

FIG. 3 is a cross-sectional view of a plate 22. The plate 22 includes a first layer 221 and a second layer 222. The first layer 221 includes several holes 223 as liquid inlets. In some embodiments, the holes 223 are connected with tubes for introducing clean liquid into the plate 22. The second layer 222 includes several through holes 224 guiding the clean liquid from the hole 223 to the top surface 1 of the semiconductor wafer 2 as previously discussed with reference to FIG. 1.

In some embodiments, the first layer 221 is made of a material selected from polyethylene terephthalate, high-density polyethylene, polyvinyl chloride, low-density polyethylene, polypropylene, polystyrene, acrylonitrile butadiene styrene, polymethylmethacrylate, poly lactic acid, polycarbonates and fiber reinforced plastic. In some embodiments, the second layer 222 is made of a piezoelectric material selected from ceramic, sapphire, tourmaline crystal, quartz crystal, topaz crystal, sodium potassium tartrate tetrahydrate crystal and polyvinylidene fluoride, Sodium potassium niobate (($K,Na)NbO_3$), Bismuth ferrite ($BiFeO_3$), Sodium niobate ($NaNbO_3$), Bismuth titanate ($Bi_4Ti_3O_{12}$), Sodium bismuth titanate ($Na_{0.5}Bi_{0.5}TiO_3$), Gallium orthophosphate crystal ($GaPO_4$), Langasite crystal ($La_3Ga_5SiO_{14}$), Barium titanate ($BaTiO_3$), Lead titanate ($PbTiO_3$), Lead zirconate titanate ($Pb[Zr_xTi_{1-x}]O_3$ $0 \leq x \leq 1$), Potassium niobate ($KNbO_3$), Lithium niobate ($LiNbO_3$), Lithium tantalite ($LiTaO_3$), Sodium tungstate ($Na_2WO_3$) and Zinc oxide (ZnO).

Figure 4:
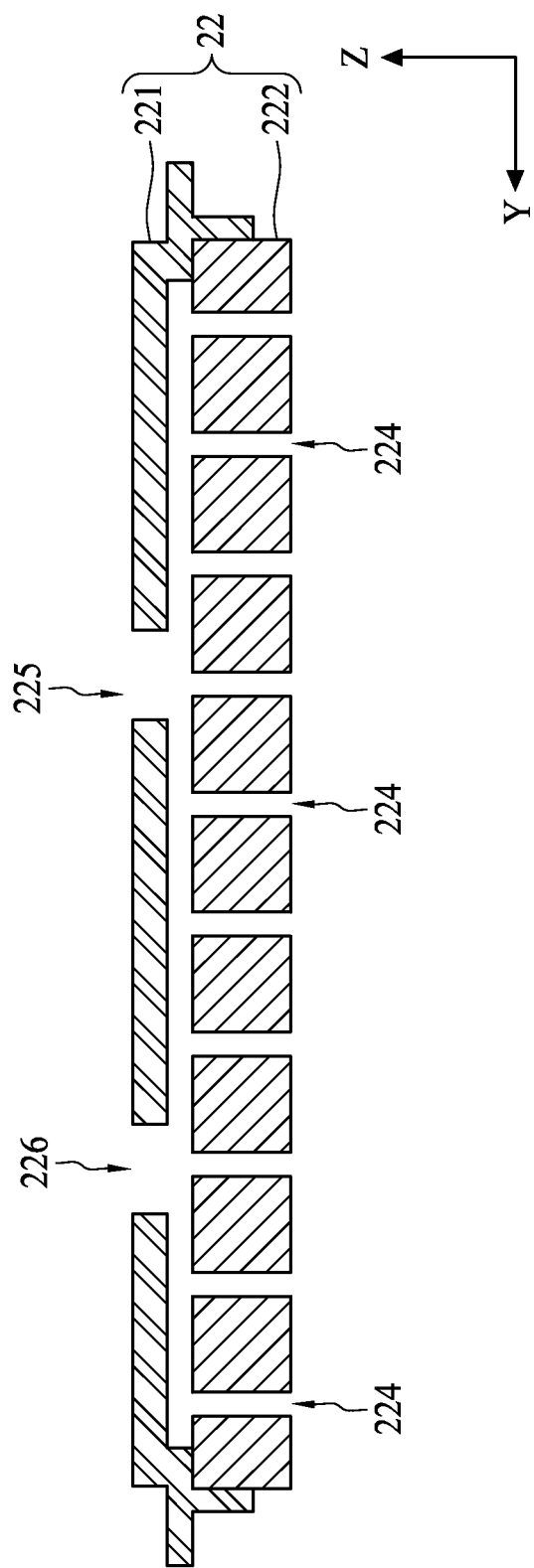
FIG. 4 is a cross-sectional view of a top layer, which include two opening. One is designed to guide liquid into the plate while the other is configured to drain the liquid from the second layer out the plate.

In some embodiments as in FIG. 4, the first layer 221 includes a first hole 225 and a second hole 226. The first hole 225 is designed for the clean liquid to flow in and the second hole 226 is configured to drain the clean liquid out so as to clean a top surface of a semiconductor wafer.

Figure 5:
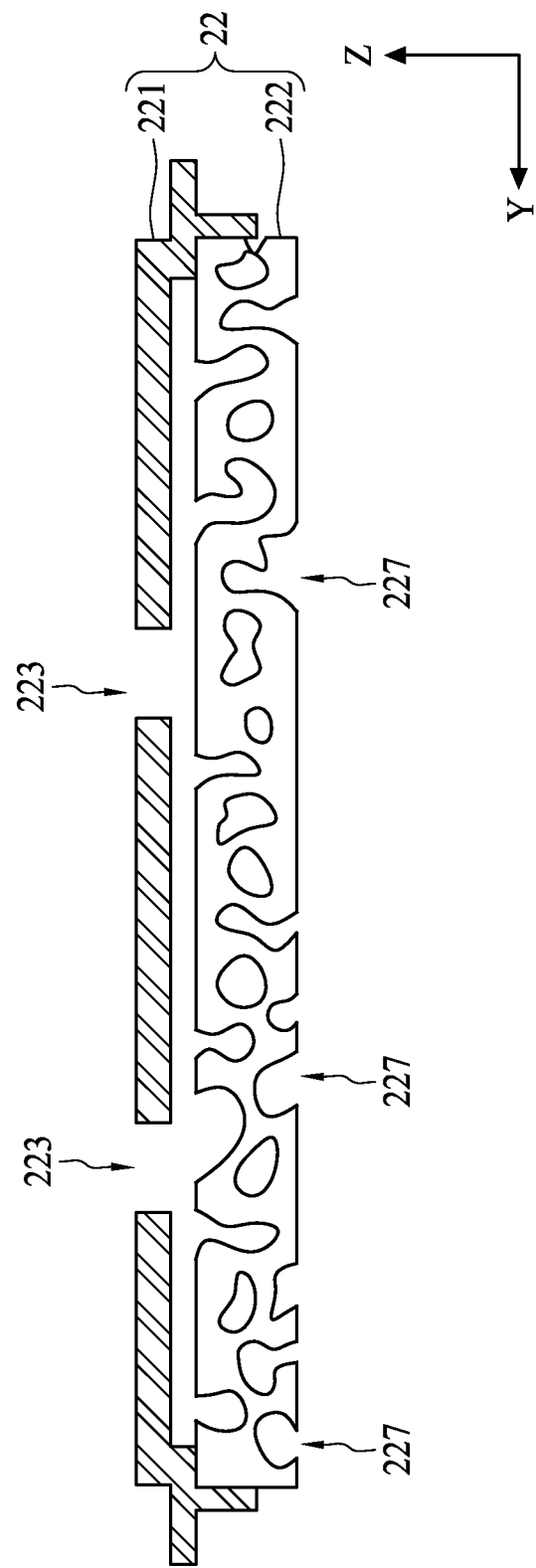
FIG. 5 is a cross-sectional view of a porous structure of the second layer, which vibrates the liquid inside the porous structure to generate ultrasonic waves.

In some embodiments as in FIG. 5, the second layer 222 includes several pores 227. In certain embodiments, some of the pores 227 are connected with each other. The pores 227 are channels to guide the clean liquid from holes 223 to a top surface of a semiconductor wafer. In certain embodiments, the pores 227 are designed to form inside the plate 22 or on a surface of the second layer 222.

In some embodiments, the plate 22 includes the second layer 222 without the first layer 211 disposed thereon. In some embodiments, a pipe is configured to directly guide the clean liquid to the through holes 224 or to the pores 227 as previously discussed with references to FIGS. 3 to 5.

Figure 6:
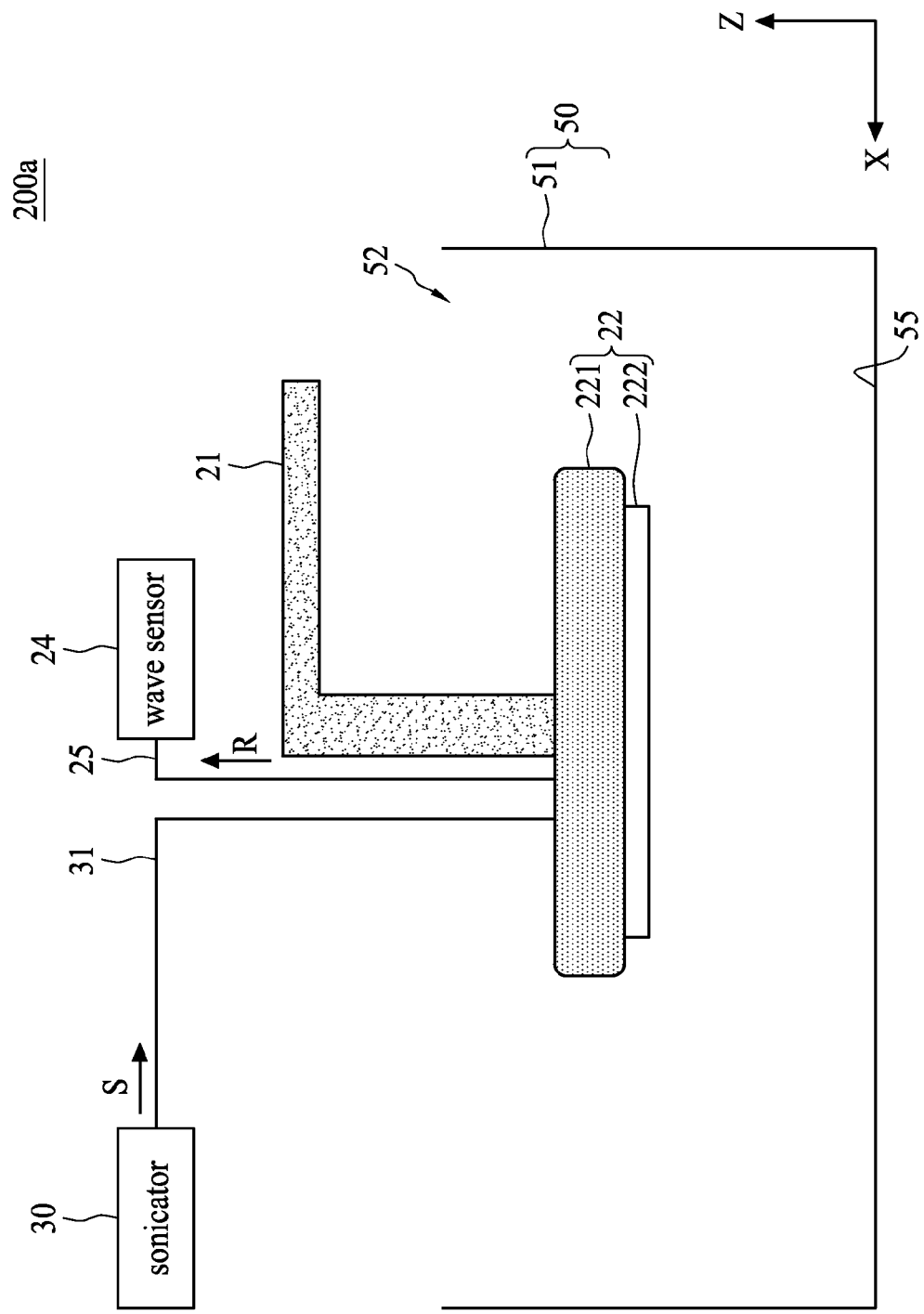
FIG. 6 is a schematic view of a portion of a semiconductor wafer cleaning system where the relationship between the sonicator and the plate is described.

FIG. 6 is a portion of a semiconductor wafer cleaning system 200a according to some embodiments of the present disclosure. A sonicator 30 is coupled to the plate 22 as previously discussed and the plate 22 is located in the container 51 of the clean unit 50. A wire 31 is designed to transfer a signal S between the sonicator 30 and a second layer 222 of the plate 22. The semiconductor wafer cleaning system 200a includes a wave sensor 24 coupled to the plate 22. An electric wire 25 is designed to transfer a reflected signal between the wave sensor 24 and the second layer 222 of the plate 22. The arm 21 is connected to the plate 22.

The sonicator 30 is designed to generate the signal S toward the plate 22. In some embodiments, the signal S has a frequency from about 20 KHz to about 40 KHz. In some other embodiments, the frequency is from about 25 KHz to about 60 KHz. In still other embodiments, the frequency is from about 28 KHz to about 80 KHz. In various embodiments, the second layer 222 is activated by the signal S so as to sonicate a liquid in the second layer 222. The previously discussed frequency is used to properly sonicate the liquid. In some embodiments, the sonicator 30 is inside the second layer 222 such that the sonicator 30 transfers the signal S without the wire 31. In some embodiments, the sonicator 30 is inside the arm 21 and the sonicator 30 is controlled correspondingly to the position of the plate 22. Once the arm 21 is located at a prearranged position, the sonicator 30 transfers the signal S to the plate 22. In some other embodiments, the signal S from the sonicator 30 is wirelessly transferred to the plate 22.

The signal S has a power for generating an ultrasonic wave. In some embodiments, the power of the ultrasonic wave generated by the sonicator 30 is adjustable. In some embodiments, the power is in a range from about 19 to about 35 W. In some other embodiments, the power is in a range from about 15 to about 23 W. In some other embodiments, the power is in a range from about 18 to about 33 W. In certain embodiments, the power is manually adjusted to the previously discussed ranges to avoid cross contamination. In some other embodiments, the power is automatically adjusted to the previously discussed ranges to prevent the power of the signal S from over 35 W. Once the power is over 35 W, the cross contamination effect occurs frequently.

The wire 31 is electrically connected between the sonicator 30 and the plate 22. In certain embodiments, the wire 31 is inside the arm 21 to prevent the wire 31 from contacting the liquid. In certain embodiments, the wire 31 is connected with the first layer 221 in order to be coupled with the second layer 222 so as to transfer the signal S to the second layer 222.

The plate 22 is used to generate the ultrasonic wave. Because the second layer 222 of the plate 22 includes a piezoelectric material, the signal S used to agitate the second layer 222 so as to generate the ultrasonic wave. In some embodiments, the first layer 221 includes a piezoelectric material, which is agitated by the signal S to generate the ultrasonic wave.

In some embodiments, the plate 22 is used to receive a reflected ultrasonic wave from a bottom surface 55 of the clean unit 50. The second layer 222 of the plate 22 converts the reflected ultrasonic wave to a reflected signal R and transfers the reflected signal R to the wave sensor 24. In other words, the piezoelectric material of the second layer 222 of the plate 22 converts the reflected ultrasonic wave from the bottom surface 55 of the container 51 to the reflected signal R. In certain embodiments, the piezoelectric material of the first layer 221 converts the reflected ultrasonic wave to the reflected signal R, which is transferred to the wave sensor 24.

The electric wire 25 is electrically connected between the plate 22 and the wave sensor 24. In some embodiments, the electric wire 25 is inside the arm 21 to prevent the electric wire 25 from contacting the liquid. In certain embodiments, the electric wire 25 is connected with the first layer 221 in order to be coupled with the second layer 222 so as to transfer the reflected signal R to the wave sensor 24.

In various embodiments, the wave sensor 24 is used to calibrate the power of the ultrasonic wave generated by the sonicator 30. In some embodiments, the wave sensor 24 calculates a reflected power corresponding to the reflected signal R. The reflected power calculated is used to check up the power of the ultrasonic wave generated by the sonicator 30. In some embodiments, the wave sensor 24 transfers the reflected signal R to a processor. The processor calculates the reflected power corresponding to the reflected signal R. The reflected power calculated is used to check up the power of the ultrasonic wave generated by the sonicator 30.

In certain embodiments, the wave sensor 24 is disposed on the plate 22. In some embodiments, the wave sensor 24 is inside the second layer 222. In some other embodiments, the wave sensor 24 is inside the arm 21 to prevent the wave sensor 24 from contacting the liquid.

In some embodiments, the wave sensor 24 transfers an adjusting signal to the sonicator 30. The power of the ultrasonic wave generated by the sonicator 30 is adjusted in accordance with the adjusting signal so as to fall into the previously discussed ranges. In certain embodiments, the second layer 222 of the plate 22 includes a wireless transmitter, which transfers the reflected signal R to the wave sensor 24. Additionally, the wave sensor 24 includes a wireless module that transfers the adjusting signal to the sonicator 30. In some other embodiments, the wave sensor 24 is used to judge whether the power of the ultrasonic wave falls within the power range as previously discussed. If not, the sonicator 30 is adjusted until the power of the ultrasonic wave falls within the range. Thus, the wave sensor 24 is designed to prevent the power of the ultrasonic wave from exceeding 35 W so as to avoid the cross contamination.

In FIG. 6, the clean unit 50 of the semiconductor wafer cleaning system 200a is configured to receive the plate 22 during the second mode. The clean unit 50 includes the container 51 used for accommodating the liquid. Moreover, the container 51 includes an opening 52 which allows the arm 21 to pivot the plate 22 through the opening 52. In some embodiments, the opening 52 is used for the liquid to pour into the container 51.

Figure 7:
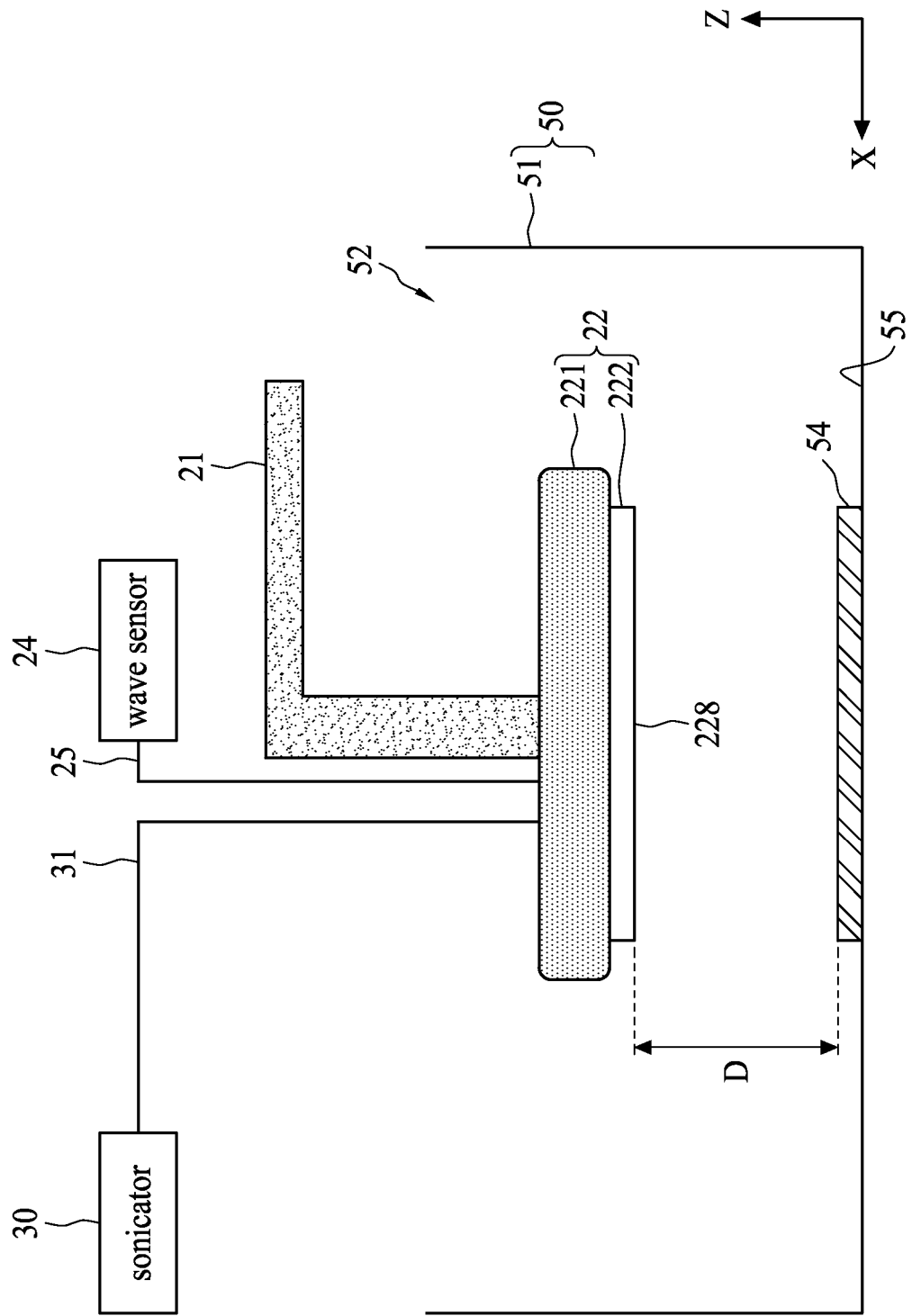
FIG. 7 is a schematic view of a portion of a semiconductor wafer cleaning system where the relationship between the wave sensor and the wave reflector is illustrated.

In some embodiments as referred in FIG. 7, the plate 22, the arm 21, the wave sensor 24, the sonicator 30, the wire 31, and the electric wire 25 are previously discussed with reference to FIG. 6. The clean unit 50 includes a wave reflector 54 that is disposed on the bottom surface 55 of the container 51. That is, the wave reflector 54 is disposed under the plate 22 and designed to reflect the ultrasonic wave from the second layer 222 of the plate 22 during the second mode for adjusting the power of the ultrasonic wave.

In other embodiments, the wave reflector 54 is disposed between the plate 22 and the container 51. In other words, the wave reflector 54 is disposed above the bottom surface 55 of the container 51

In order for the precise adjustment of the ultrasonic power, the gap D between the wave reflector 54 and a surface 228 of the plate 22 is a predetermined distance. In some embodiments, the predetermined gap D is between about 1 mm and about 4 mm. In certain embodiments, the predetermined gap D is between about 0.5 mm and about 2.8 mm. In other embodiments, the predetermined gap D is between about 1.7 mm and about 3.1 mm. In some other embodiments, the predetermined gap D is between about 1.3 mm and about 4.6 mm. The previous gap distance is designed to eliminate the deviation of the power of the ultrasonic wave to avoid cross contamination.

Figure 8:
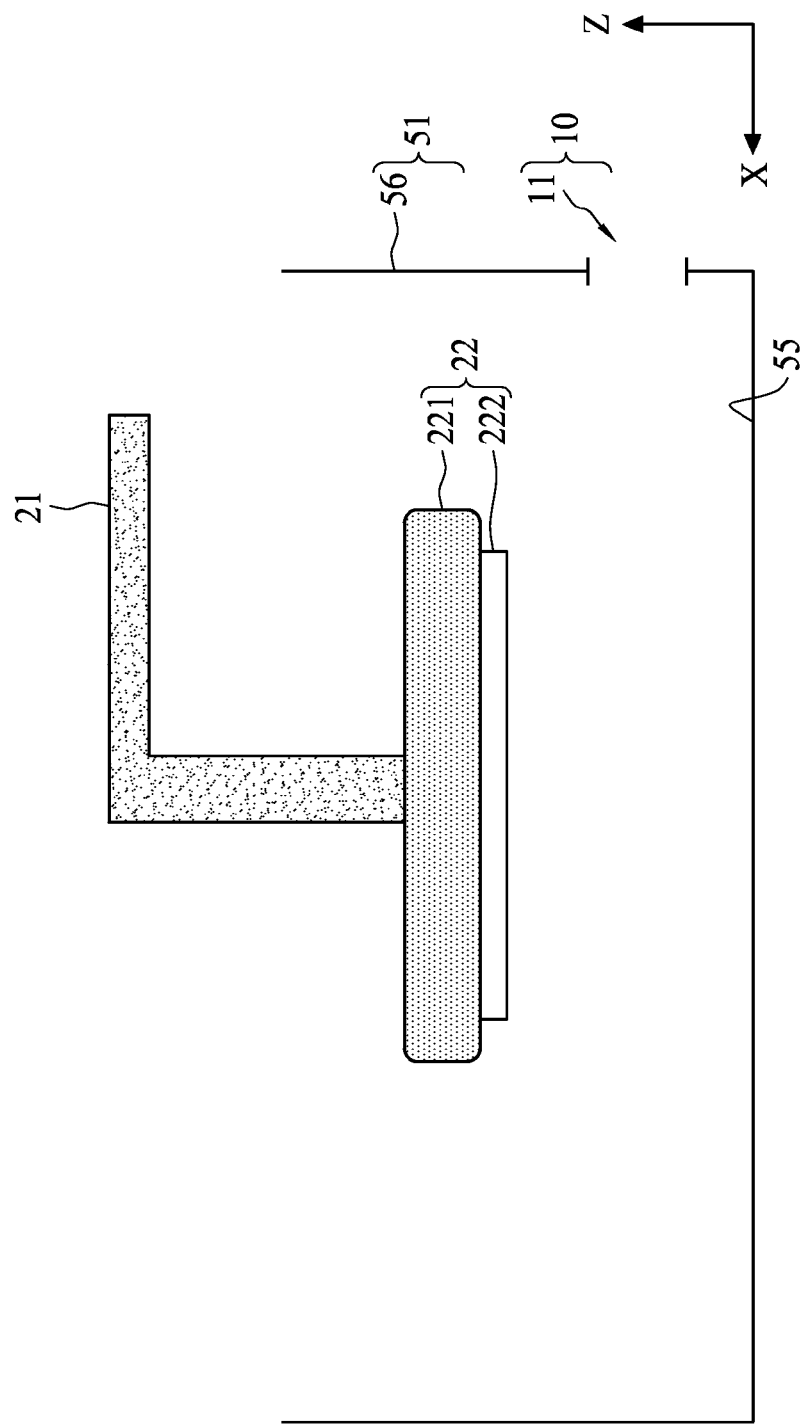
FIG. 8 is a schematic view of a portion of a semiconductor wafer cleaning system where the position of the particle removal component is described.

FIG. 8 is a portion of a semiconductor wafer cleaning system 200b according to some embodiments of the present disclosure. The plate 22 and the arm 21 are previously discussed with reference to FIG. 6. The semiconductor wafer cleaning system 200b includes a particle removal component 10 designed for cleaning the plate 22. For instance, the particle removal component 10 utilizes, but not limited to, a stream of flow to detach the particles trapped inside the second layer 222 of the plate 22.

In some embodiments as referred in FIG. 8, the particle removal component 10 includes an exit 11. The exit 11 is disposed at a wall 56 of the container 51 and designed to drain the liquid out so as to form a stream of flow. The stream of flow detaches the particle and carries the particle out of the container 51. Thus, the plate 22 is cleaned by the particle removal component 10.

Figure 9:
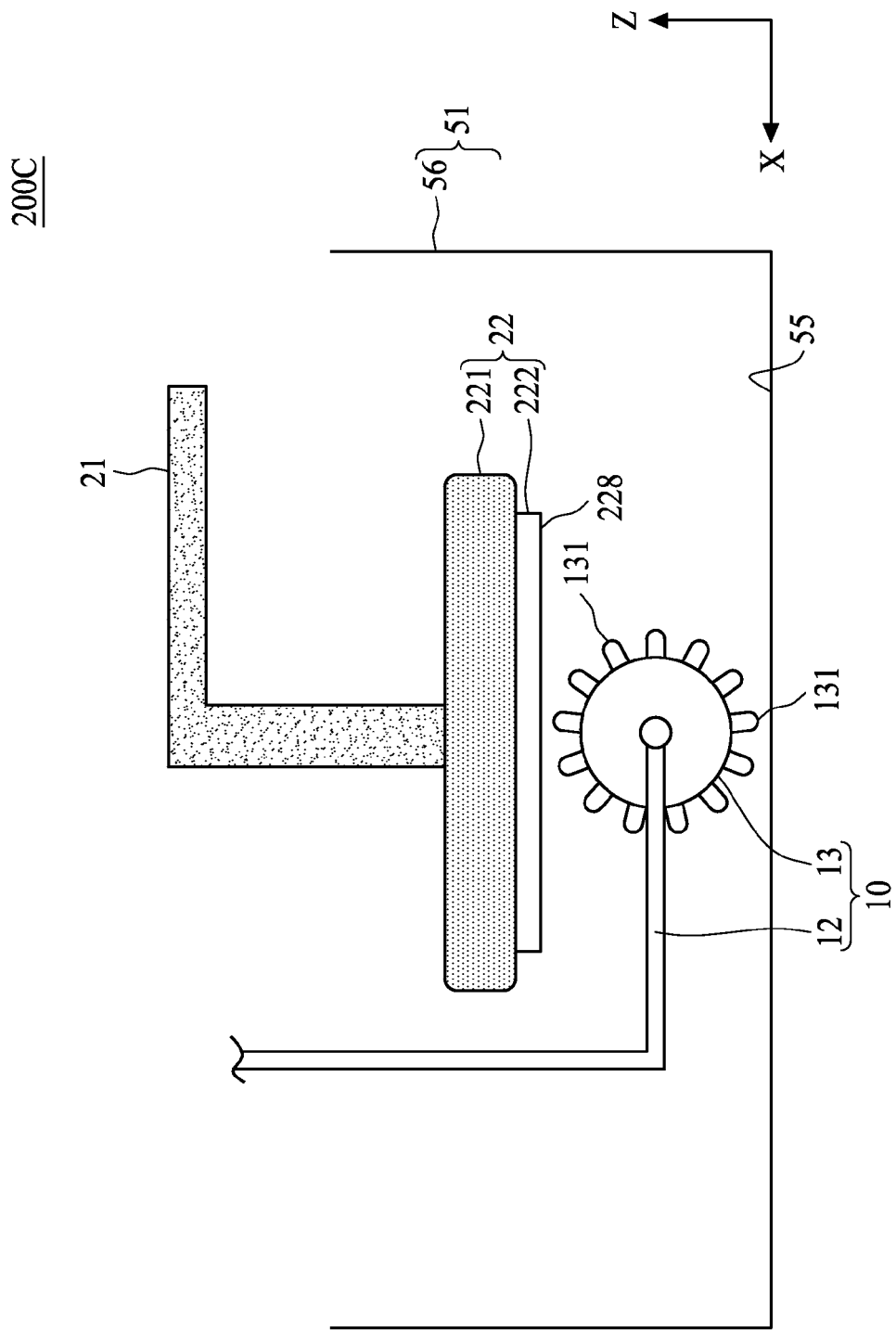
FIG. 9 is a schematic view of a portion of a semiconductor wafer cleaning system where the relationship between the cleaning bar and the plate is illustrated.

FIG. 9 is a portion of a semiconductor wafer cleaning system 200c according to some embodiments of the present disclosure. The particle removal component 10 includes a moving arm 12 and a cleaning bar 13, which is pivoted to the moving arm 12. The cleaning bar 13 includes several protrusions 131 that are used to scrub the plate 22. Mechanical cleaning force is applied to the plate 22 and the particles are removed from the plate 22.

Figure 10:
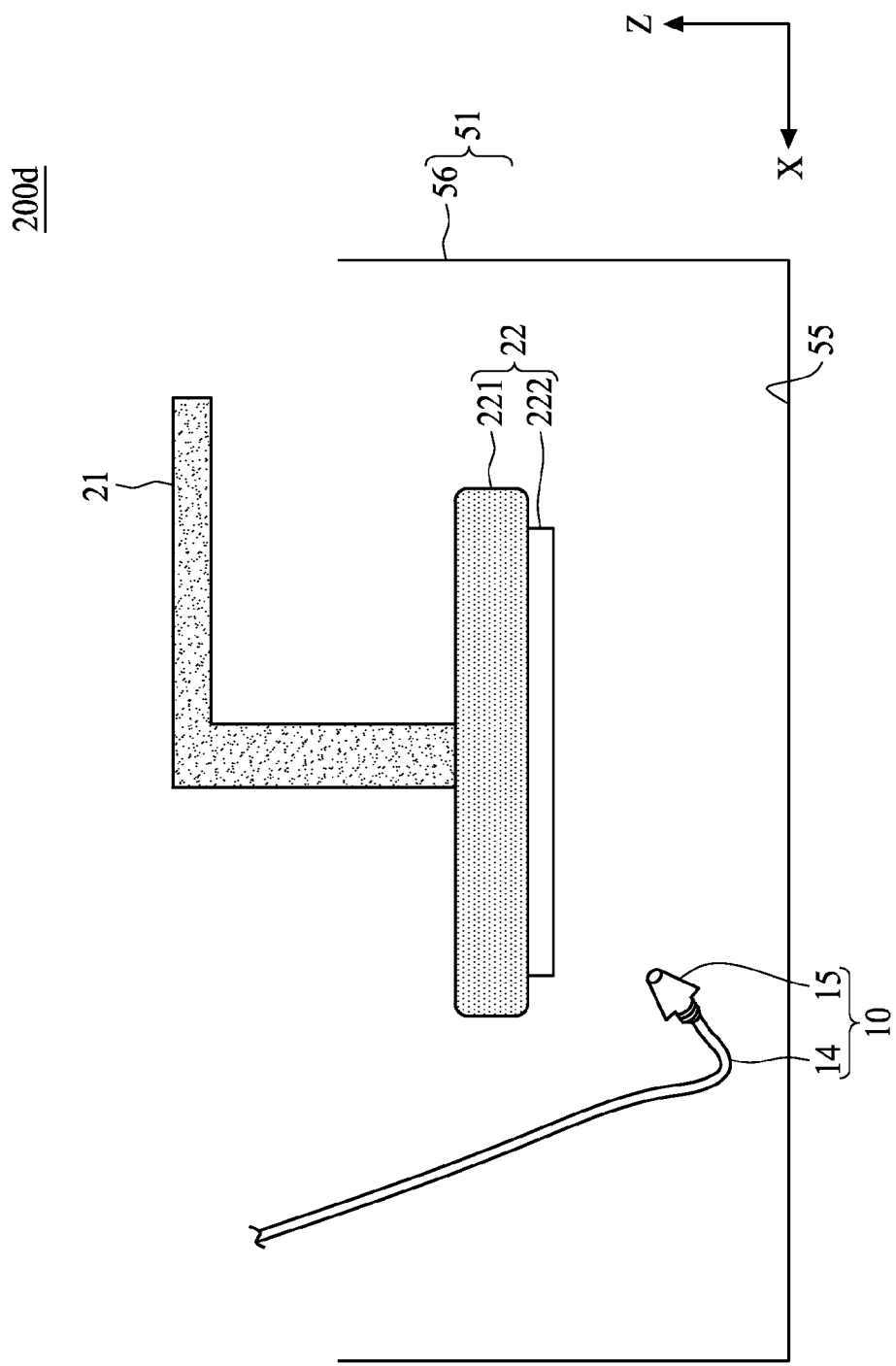
FIG. 10 is a schematic view of a portion of a semiconductor wafer cleaning system where the relationship between the nozzle and the plate is described.

FIG. 10 is a portion of a semiconductor wafer cleaning system 200d according to some embodiments of the present disclosure. The plate 22, the arm 21, and the container 51 are previously discussed with reference to FIG. 6. The particle removal component 10 includes a tube 14 and a nozzle 15, which is connected to the tube 14. The tube 14 is designed to guide the liquid to the nozzle 15 and the nozzle 15 is used to eject the liquid to the plate 22 for cleaning.

Figure 11:
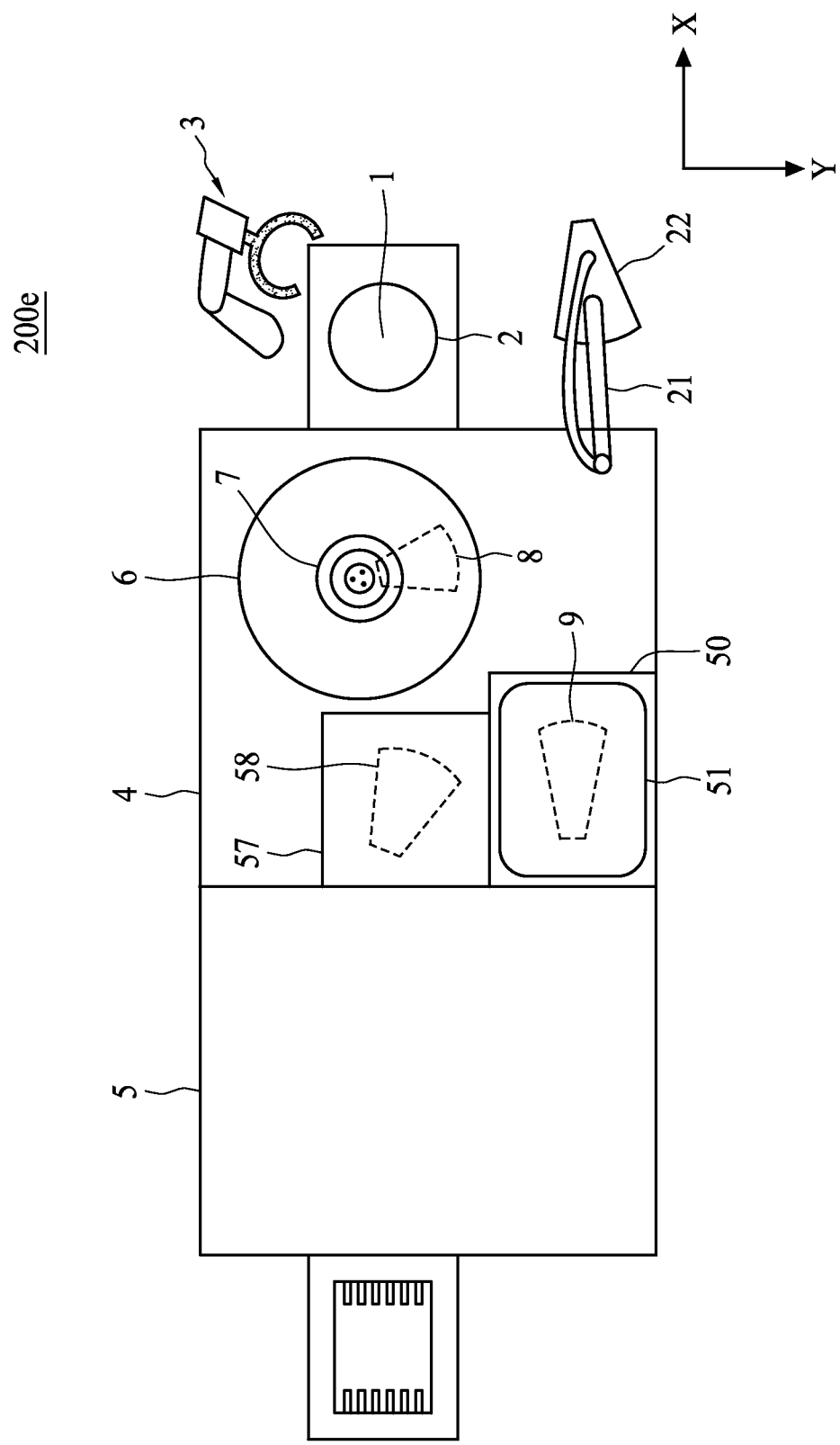
FIG. 11 is a schematic view of a semiconductor wafer cleaning system for cleaning a plate in different modes.

FIG. 11 is a semiconductor wafer cleaning system 200e according to some embodiments of the present disclosure. The top surface 1, the semiconductor wafer 2, the loader 3, the chambers 4 and 5, the cup 6, the wafer chuck 7, the clean unit 50, the container 51, the arm 21 and the plate 22 are previously discussed with reference to FIG. 1. The semiconductor wafer cleaning system 200e further includes an IPA tank 57. The semiconductor wafer cleaning system 200e is designed to be able to operate under a third mode. Under the third mode, the plate 22 is located at a position 58. In some embodiments, the third mode is a dry mode, which indicates that the plate 22 is dried in the IPA tank 57.

Figure 12:
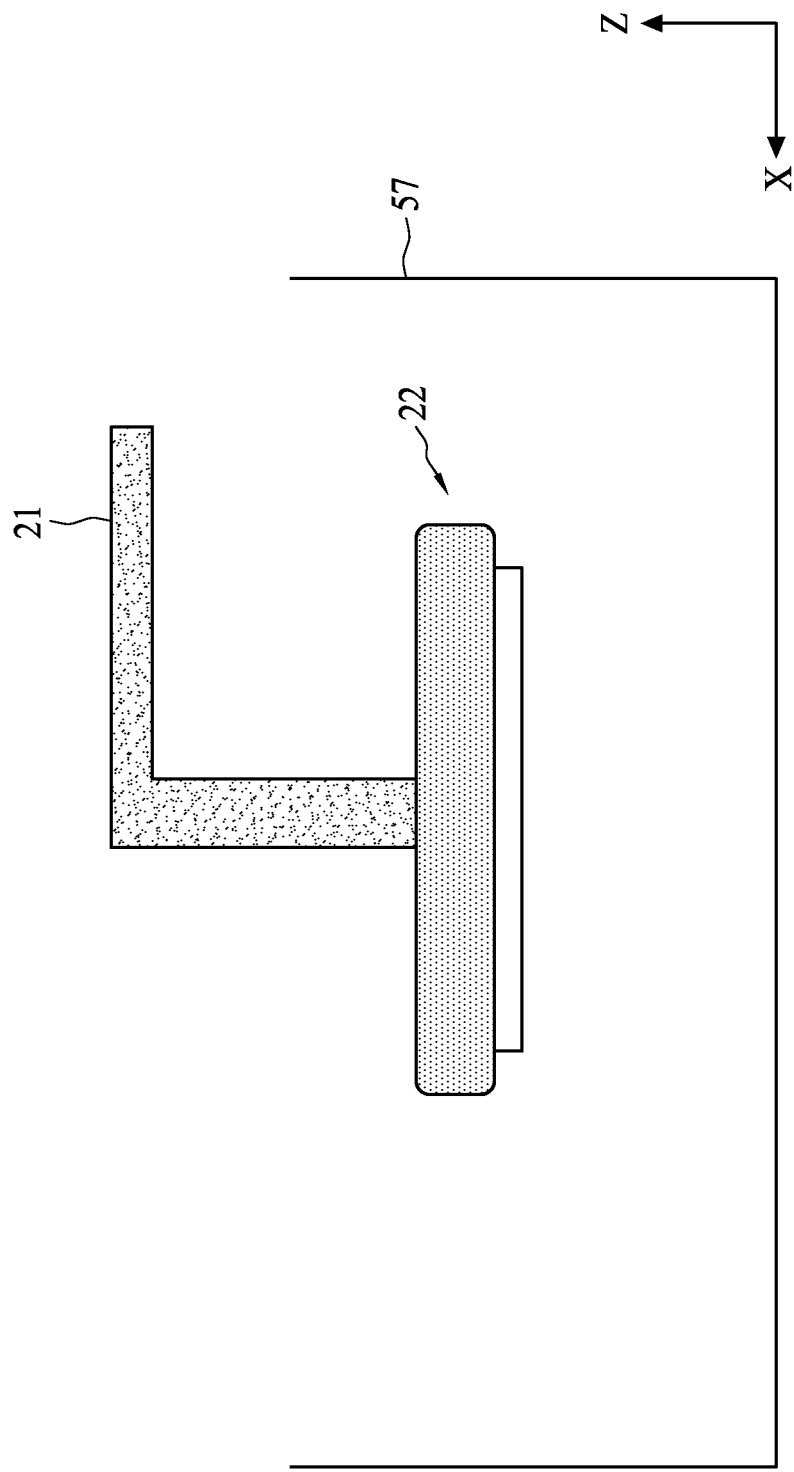
FIG. 12 is a schematic view of a portion of a semiconductor wafer cleaning system where an IPA tank and the location thereof are described.

FIG. 12 is an enlarged view of the IPA tank 57 designed for dehydrating the plate 22. The IPA tank 57 is used to accommodate the non-polar solvent for dehydrating the plate 22. In certain embodiments, the IPA tank 57 is replaced by a heating element, which dries the plate 22 during the third mode. Thus, the plate 22 is heated by the heating element.

Figure 13:
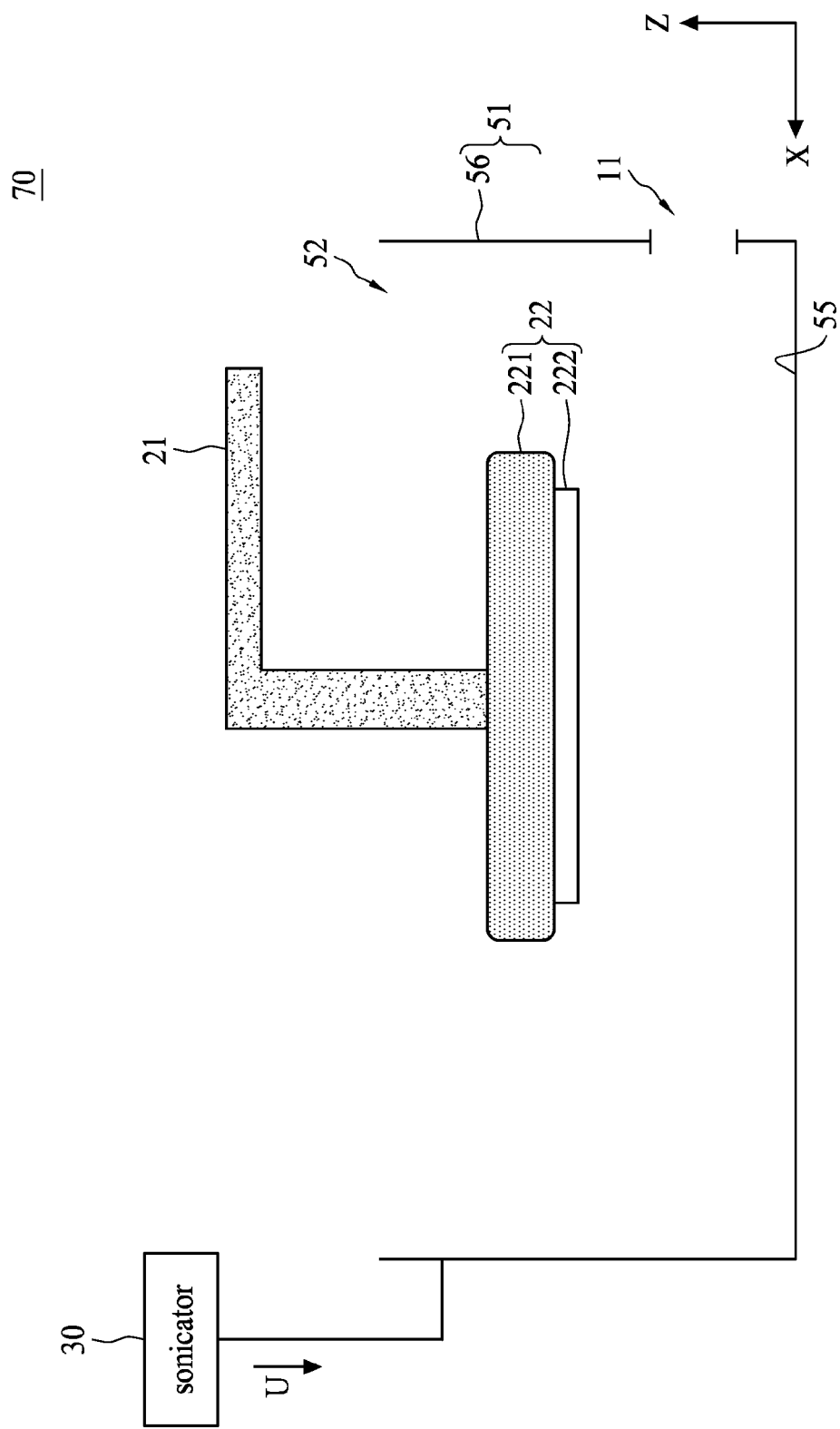
FIG. 13 is a schematic view of an apparatus of a semiconductor wafer cleaning system where the relationship between the sonicator and the exit is illustrated.

FIG. 13 is an apparatus 70 used for cleaning a plate 22 designed for cleaning a wafer surface. The apparatus 70 includes a container 51, an exit 11 and a sonicator 30 as previously discussed. However, the sonicator 30 is coupled to the container 51 for generating an ultrasonic wave.

In some embodiments, the container 51 has an opening 52 and a bottom surface 55. The opening 52 is configured to receive the plate 22. In addition, the container 51 is made of a piezoelectric material selected from ceramic, sapphire, tourmaline crystal, quartz crystal, topaz crystal, sodium potassium tartrate tetrahydrate crystal and polyvinylidene fluoride, Sodium potassium niobate ((K,Na)NbO$_3$), Bismuth ferrite (BiFeO$_3$), Sodium niobate (NaNbO$_3$), Bismuth titanate (Bi$_4$Ti$_3$O$_{12}$), Sodium bismuth titanate (Na$_{0.5}$Bi$_{0.5}$TiO$_3$), Gallium orthophosphate crystal (GaPO$_4$), Langasite crystal (La$_3$Ga$_5$SiO$_{14}$), Barium titanate (BaTiO$_3$), Lead titanate (PbTiO$_3$), Lead zirconate titanate (Pb[Zr$_x$Ti$_{1-x}$]O$_3$ 0≤x≤1), Potassium niobate (KNbO$_3$), Lithium niobate (LiNbO$_3$), Lithium tantalite (LiTaO$_3$), Sodium tungstate (Na$_2$WO$_3$) and Zinc oxide (ZnO).

In some embodiments, the exit 11 is located at the wall 56 of the container 51. However, in certain embodiments, the exit 11 is disposed at the bottom surface 55 of the container 51.

In some embodiments, the sonicator 30 coupled to the container 51 generates a signal U toward the container 51. In some embodiments, the signal has a frequency from about 19 KHz to about 39 KHz. In other embodiments, the frequency is from about 26 KHz to about 61 KHz. In still other embodiments, the frequency is from about 29 KHz to about 79 KHz. The previously discussed frequency is used to properly agitate the liquid. In certain embodiments, the container 51 is agitated by the signal U so as to sonicate the liquid in the container 51 and to generate an ultrasonic wave.

In some embodiments, the power of the ultrasonic wave from the sonicator 30 is adjustable. In some embodiments, the ultrasonic power is adjustable in a range from about 18 to about 35 W. In other embodiments, the power is in a range from about 14 to about 22 W. In some other embodiment, the power is in a range from about 17 to about 34 W.

Figure 14:
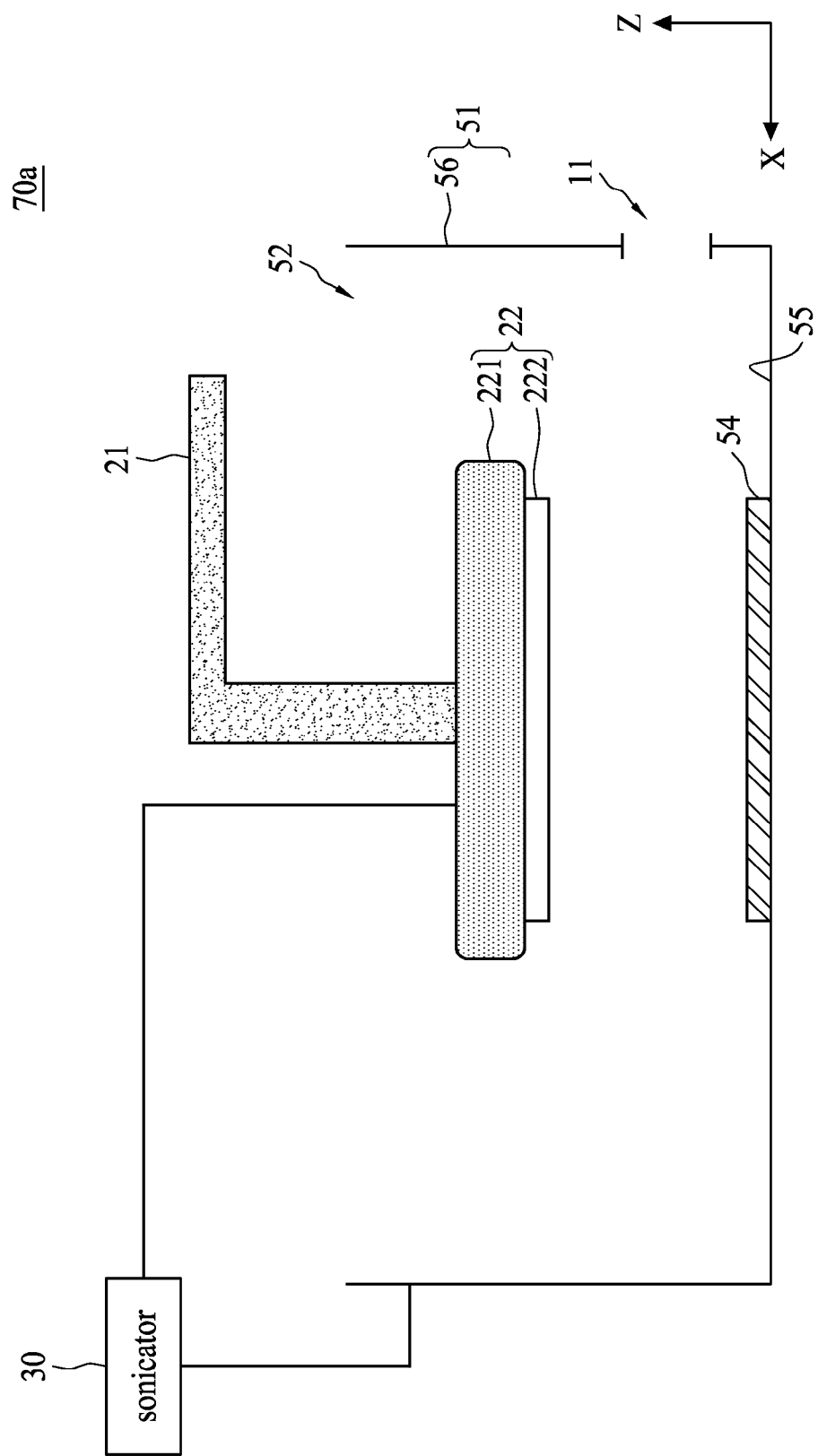
FIG. 14 is a schematic view of an apparatus of a semiconductor wafer cleaning system where the coupling relationship among the sonicator, the plate and the container is described.

FIG. 14 is an apparatus 70a according to some embodiments of the present disclosure. The sonicator 30 is coupled to the plate 22 and the container 51. In addition, the container 51 includes the wave reflector 54 which is protruded from the bottom surface 55 of the container 51. The wave reflector 54 is disposed parallel to the second layer 222 of the plate 22 for a complete wave reflection without deviation. Furthermore, because the sonicator 30 is coupled to the plate 22 and the container 51, the plate 22 and the container 51 are simultaneously agitated and oscillate with greater amplitude at some frequencies so as to form the ultrasonic wave. The frequency is from about 29 KHz to about 35 KHz. In some other embodiments, the frequency is from about 31 KHz to about 58 KHz. In still other embodiments, the frequency is from about 37 KHz to about 67 KHz. In addition, the exit 11 is used to form the stream of flow, which is able to carry the particles, detached by the ultrasonic wave, out of the container 51.

Figure 15:
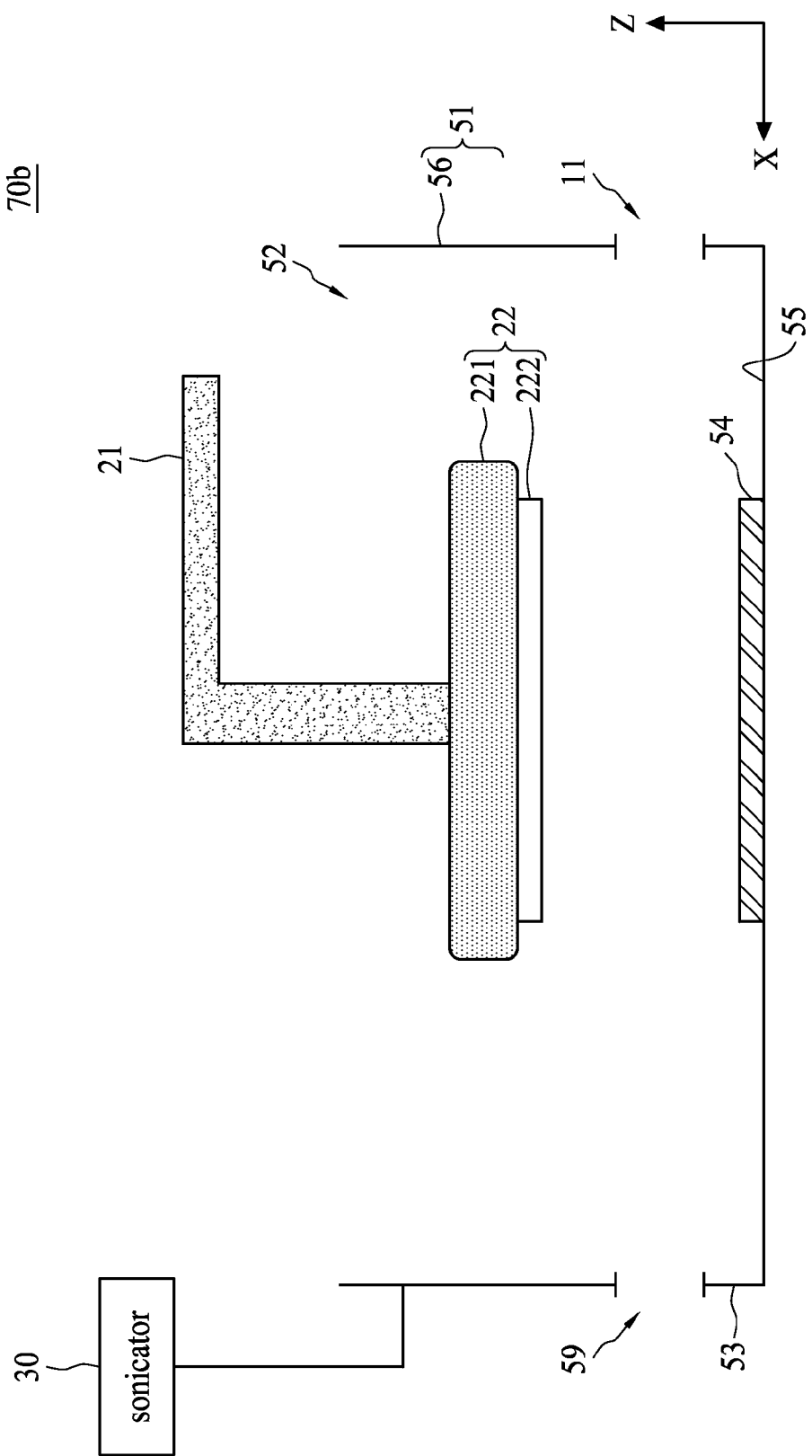
FIG. 15 is a schematic view of an apparatus of a semiconductor wafer cleaning system where the relationship between the inlet and the exit is described.

FIG. 15 is an apparatus 70b according to some embodiments of the present disclosure. The apparatus 70b further includes an inlet 59, which is disposed on a first side 53 of the container 51. The first side 53 is disposed corresponding to the wall 56. In other words, the inlet 59 is disposed relative to the exit 11. The inlet 59 and the exit 11 are designed to form a stream of flow. The inlet 59 and the exit 11 to form a turbulence of flow toward the plate 22 for cleaning the plate 22.

Figure 16:
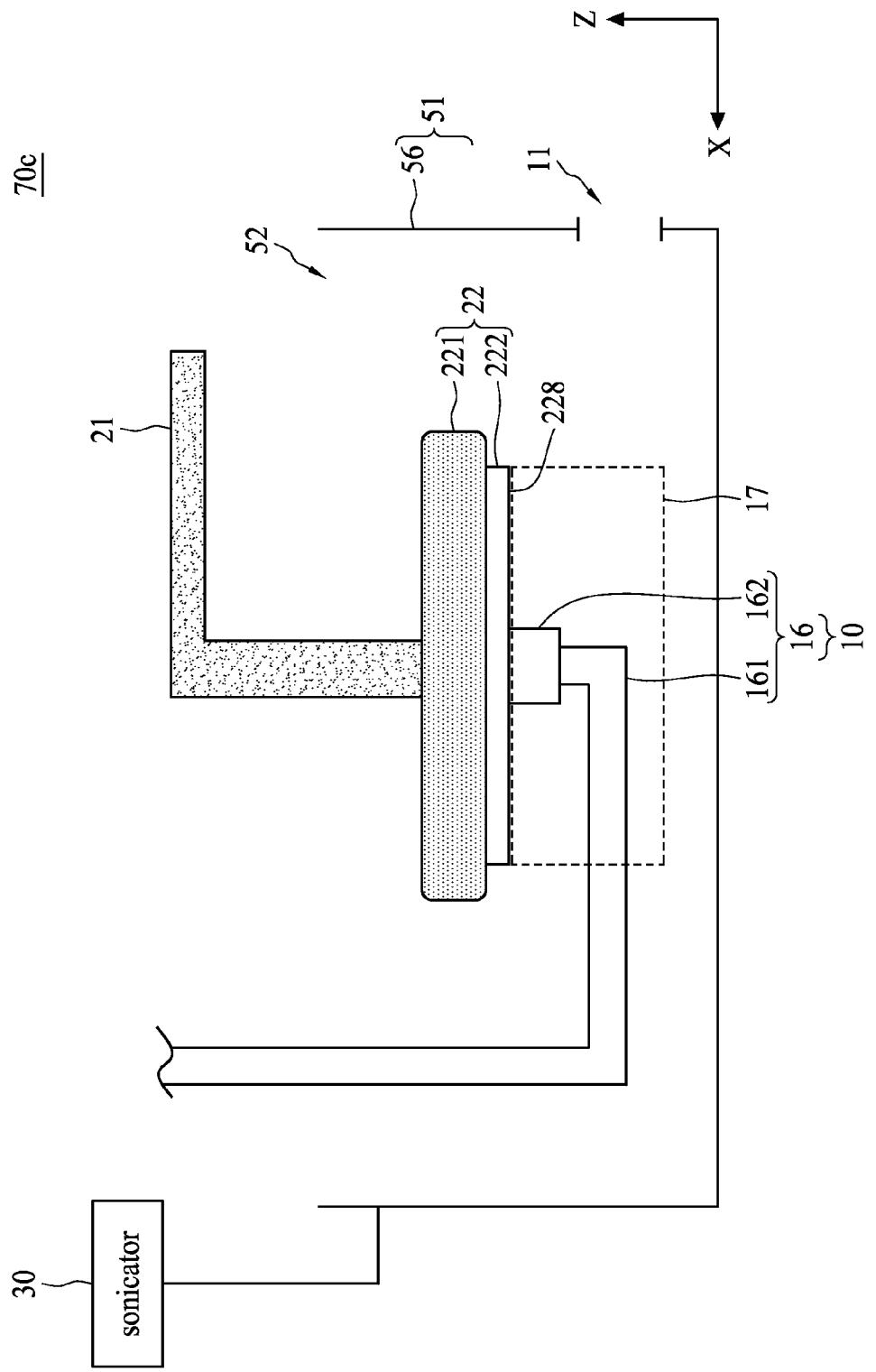
FIG. 16 is a schematic view of an apparatus of a semiconductor wafer cleaning system where the brush is illustrated.

FIG. 16 is an apparatus 70c according to some embodiments of the present disclosure. The apparatus 70c includes a particle removal component 10. The particle removal component 10 has a brush 16 including a brush arm 161 and a brush head 162 connected with the brush arm 161. The brush head 162 is pivoted on the brush arm 161. The brush arm 161 is designed to move along X, or Z direction. In certain embodiments, the brush head 162 is swiveled by the brush arm 161 for cleaning the second layer 222 of the plate 22. In other words, the brush 16 is designed to travel in a lower portion 17 of the container 51.

Figure 17:
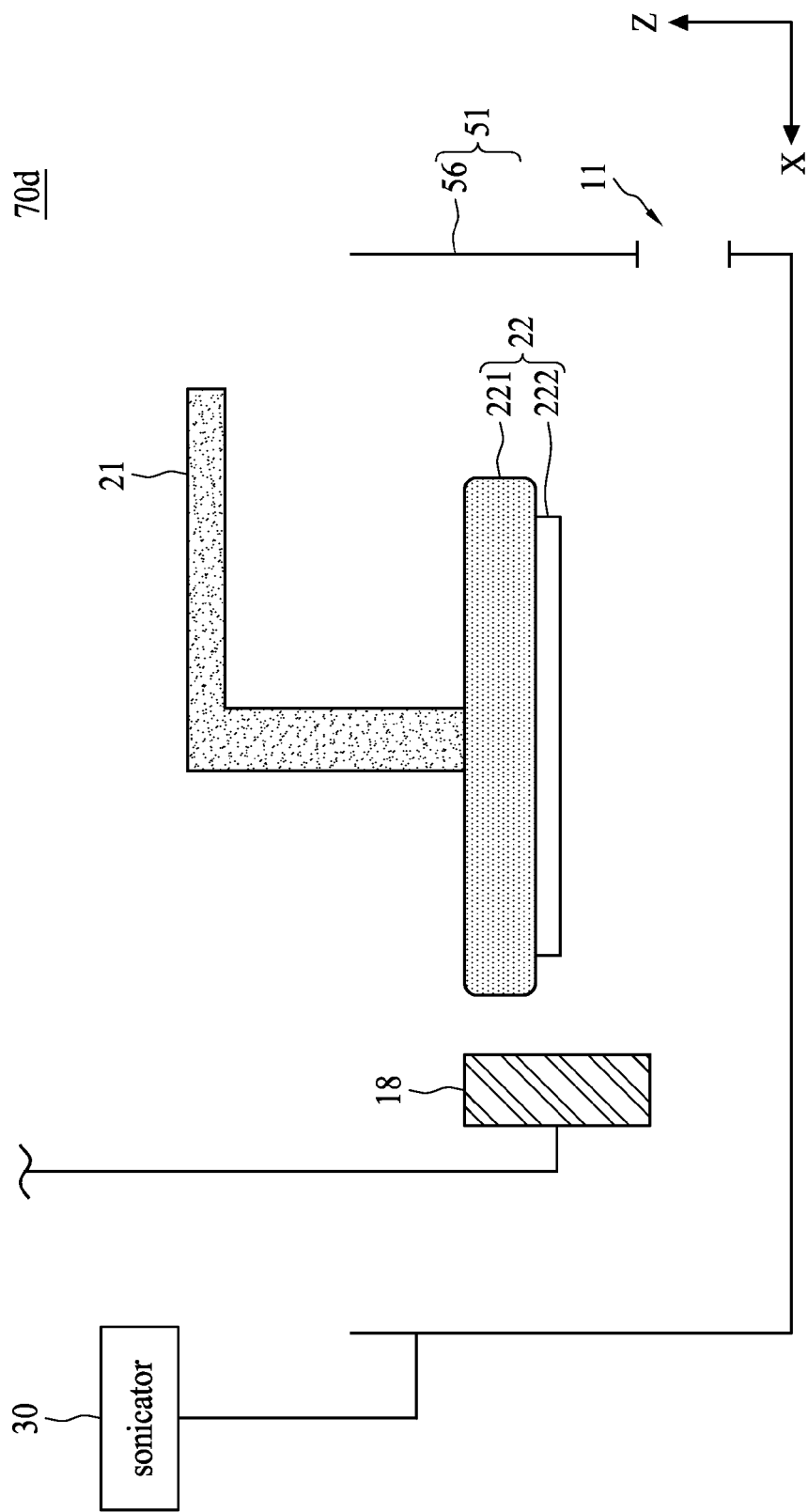
FIG. 17 is a schematic view of an apparatus of a semiconductor wafer cleaning system where the relationship between the heating element and the plate is described.

FIG. 17 is an apparatus 70d according to some embodiments of the present disclosure. The apparatus 70d includes a heating element 18, which is used to dehydrate the plate 22 in the third mode. In certain embodiments, the heating element 18 is an IR lamp, which dehydrates the plate 22 by irradiation. In some other embodiments, the heating element 18 is an electric heating device, which blows hot air to dry the plate 22.

Figure 18:
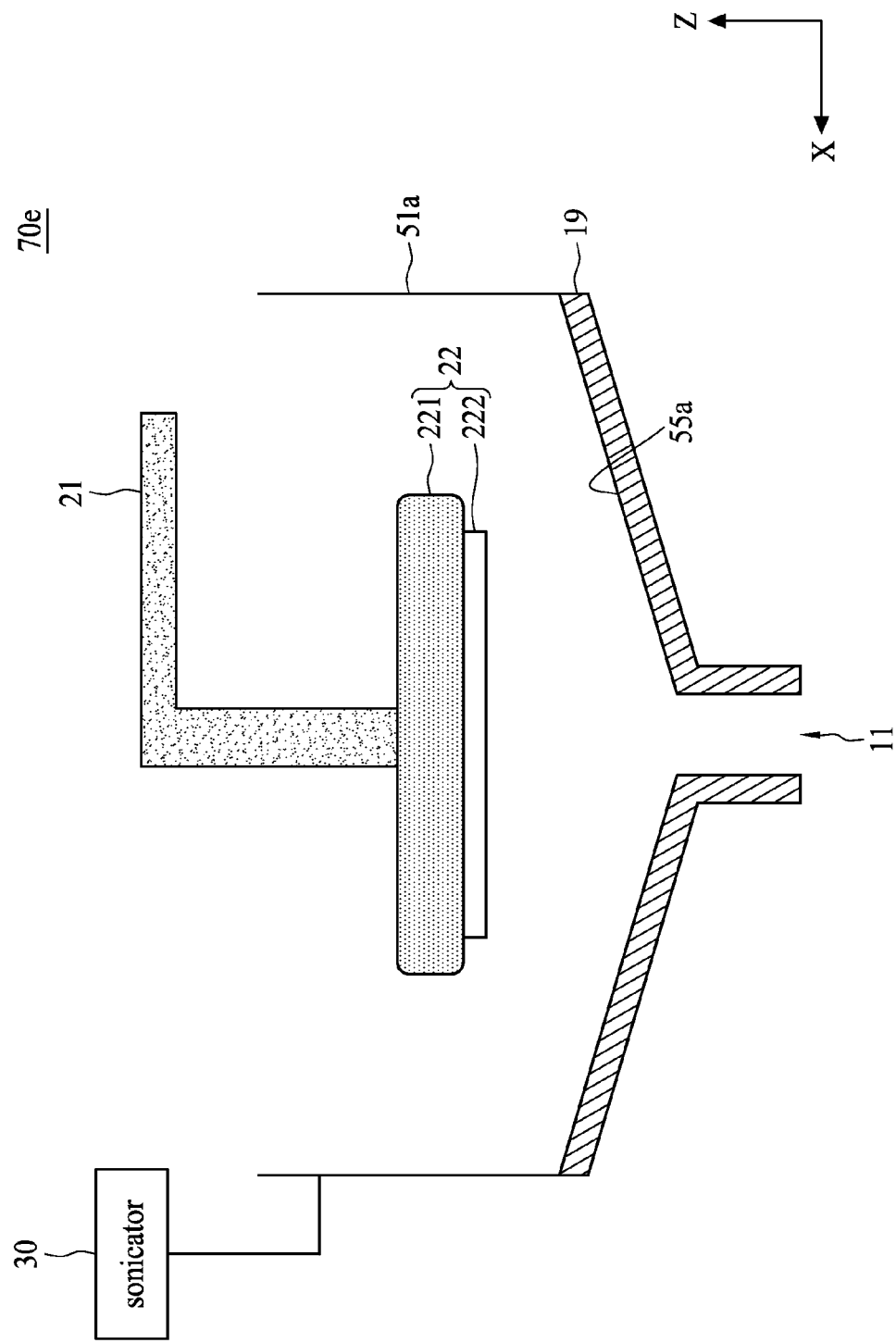
FIG. 18 is a schematic view of an apparatus of a semiconductor wafer cleaning system where the relationship between a funneled container and the exit is illustrated.

FIG. 18 is an apparatus 70e according to some embodiments of the present disclosure. The container 51a is in a conical shape. The exit 11 is disposed at the bottom of the container 51a. The apparatus 70e includes an electric dipole 19 which is disposed at the bottom surface 55a of the container 51a. The electric dipole 19 is designed for detaching the particles from the second layer 222 of the plate 22 through electric attraction force. In certain embodiments, the electric dipole 19 is disposed adjacent to the plate 22 during a predetermined mode for maximizing the electric attraction force between the electric dipole 19 and particles in the plate 22. In some other embodiments, the electric dipole 19 is disposed between the plate 22 and the container 51 as previously discussed to detach the particles.

Figure 19:
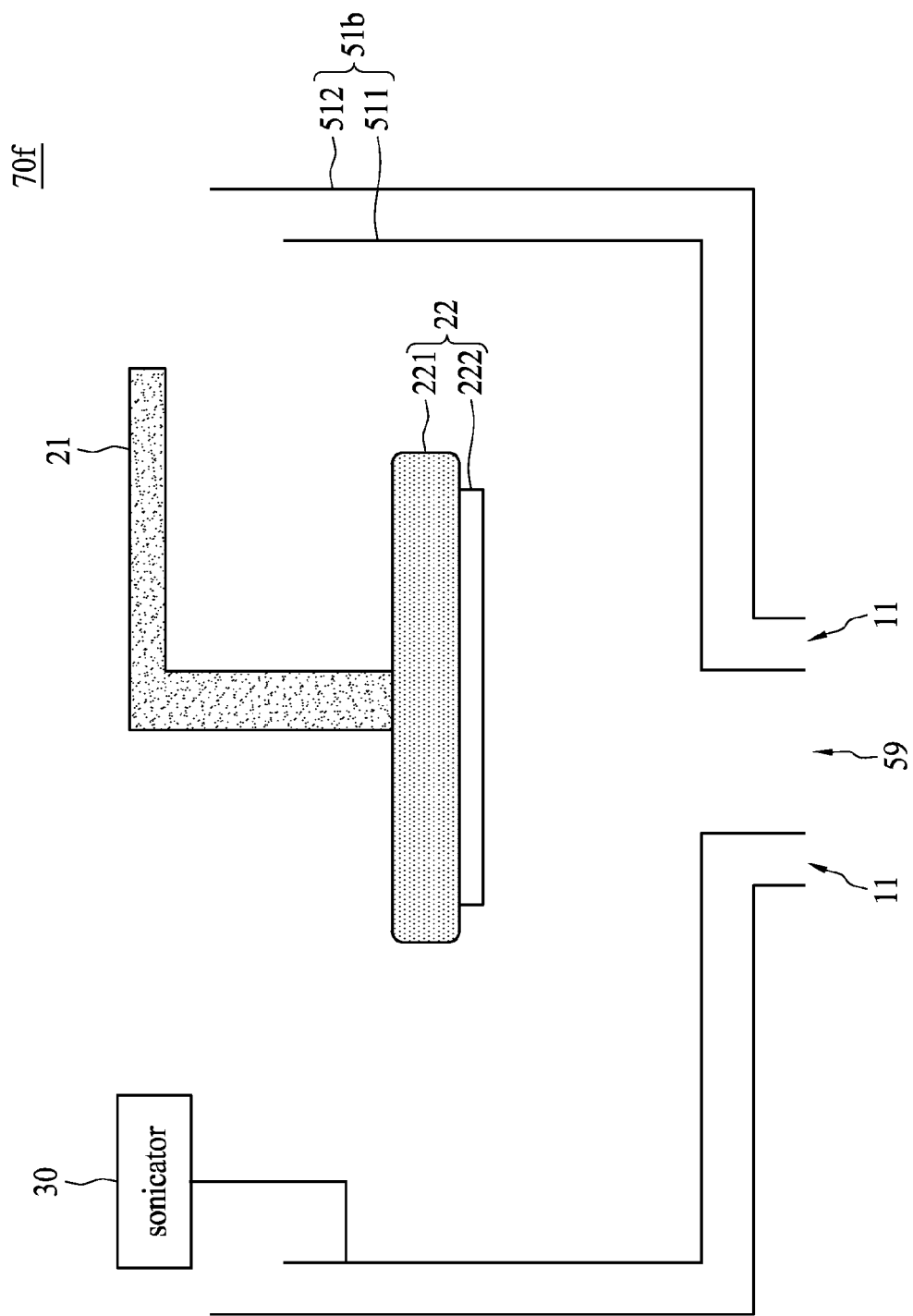
FIG. 19 is a schematic view of an apparatus of a semiconductor wafer cleaning system where a container including two walls with different heights is described.

FIG. 19 is an apparatus 70f according to some embodiments of the present disclosure. The apparatus 70f has a container 51b including a first wall 511 and a second wall 512. The height of the second wall 512 is higher than the height of the first wall 511. The second wall 512 surrounds the first wall 511. The inlet 59 is disposed at the bottom of the first wall 511 while the exit 11 is disposed around the inlet 59. Because the sonicator 30 is coupled to the first wall 511, the first wall 511 is agitated to form the ultrasonic wave. The inlet 59 is disposed under the plate 22 and form a flow to detach the particles trapped into the plate 22.

Figure 20:
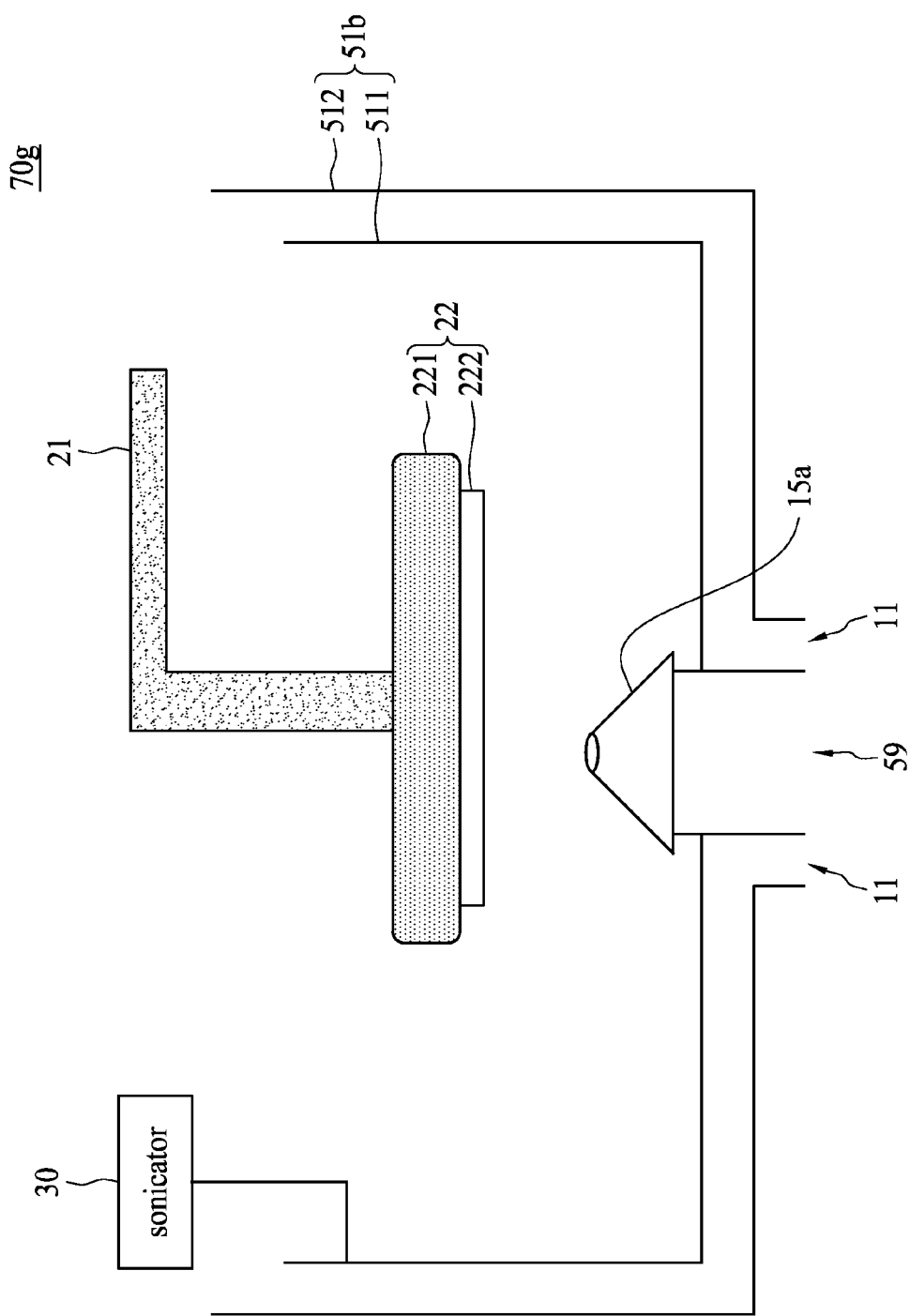
FIG. 20 is a schematic view of an apparatus of a semiconductor wafer cleaning system where the relationship between the nozzle and the plate in the container with two walls is illustrated.

FIG. 20 is an apparatus 70g according to some embodiments of the present disclosure. The apparatus 70g includes a nozzle 15a, which is connected with the inlet 59. In other words, the nozzle 15a is in the container 51b. The nozzle 15a is used to from a turbulence of flow toward the second layer 222 of the plate 22 and to detach the particles from the plate 22.

A method of cleaning a plate designed to clean a wafer surface is through a stream of flow, a turbulence of flow, a mechanical cleaning force or a combination thereof. The method includes a number of operations and the description and illustration are not deemed as a limitation as the order of the operations.

A term "moving" or "moved" is used in the present disclosure to describe an operation of locating an object to a specific site. The moving operation includes various steps and processes and varies in accordance with the features of embodiments. In some embodiments, a moving operation includes locating a plate to a container, a tank or a cup. In certain embodiments, a moving operation includes locating a plate to a position during a specific mode.

A term "immersing" or "immersed" is used in the present disclosure to describe an operation of covering an object with a liquid. The liquid is a hydrophilic solvent or a hydrophobic solvent. The immersing operation includes various steps and processes and varies in accordance with the features of embodiments. In some embodiments, an immersing operation includes covering a portion of the object. For instance, immersing the plate indicates immersing the second layer instead of the first layer, which is disposed on the second layer.

A term "applying" or "applied" is used in the present disclosure to describe an operation of enforcing a power on an object or an intermediate. The applying operation includes various steps and processes and varies in accordance with the features of embodiments. In some embodiments, the applying operation includes agitating the liquid to form the ultrasonic wave which is transferred toward the plate.

A term "dehydrating" or "dehydrated" is used in the present disclosure to describe an operation of taking moisture out of an object. The dehydrating operation includes various steps and processes and varies in accordance with the features of embodiments. In some embodiments, the dehydrating operation includes drying out the plate. In certain embodiments, the dehydrating operation includes heating the plate to remove the moisture.

A term "sensing" or "sensed" is used in the present disclosure to describe an operation of receiving the reflected ultrasonic wave. The sensing operation includes various steps and processes and varies in accordance with the features of embodiments. In some embodiments, the sensing operation includes receiving the reflected ultrasonic wave from the container. In certain embodiments, the sensing operation includes receiving the reflected ultrasonic wave from the wave reflector.

A term "swiveling" or "swiveled" is used in the present disclosure to describe an operation of rotating an object corresponding to the container. The swiveling operation includes various steps and processes and varies in accordance with the features of embodiments. In some embodiments, the swiveling operation includes rotating the plate parallel to the bottom surface of the container.

A term "scrubbing" or "scrubbed" is used in the present disclosure to describe an operation of cleaning an object with gentle rubbing. The scrubbing operation includes various steps and processes and varies in accordance with the features of embodiments. In some embodiments, the scrubbing operation includes rubbing a surface of the plate.

Figure 21:
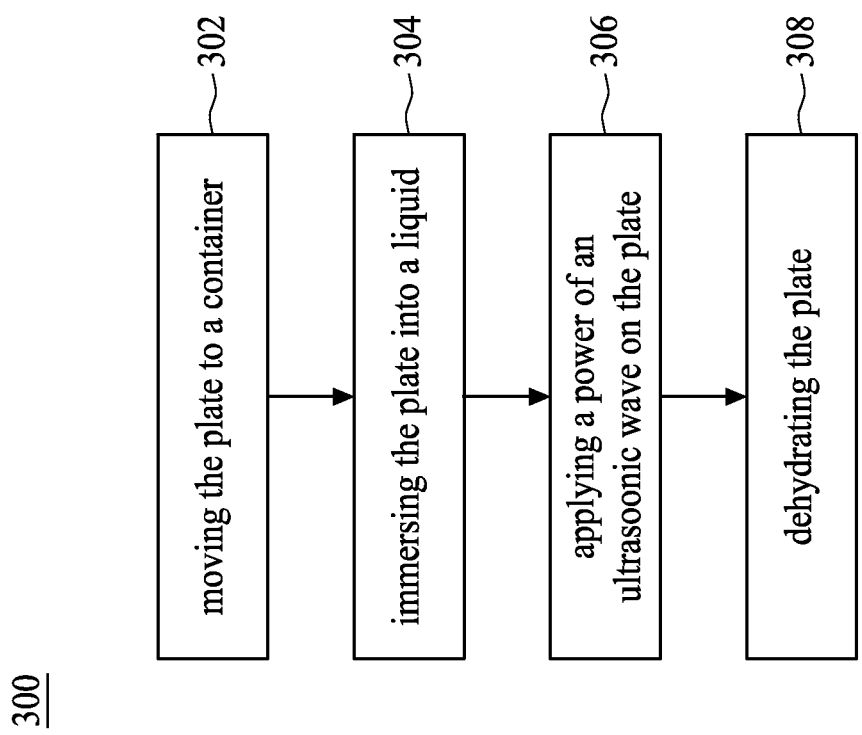
FIG. 21 is a diagram of a method for cleaning a plate designed for cleaning a wafer surface.

FIG. 21 is a diagram of a method 300 for cleaning a plate designed for cleaning a wafer surface, according to some embodiments of the present disclosure. The method 300 includes several operations, which are discussed in detail with reference to FIGS. 22 to 26. At operation 302, the plate 22 is moved to a container 51. At operation 304, the plate 22 is immersed into a liquid 40. At operation 306, a power of an ultrasonic wave is applied on the plate 22. At operation 308, the plate 22 is dehydrated.

Figure 22:
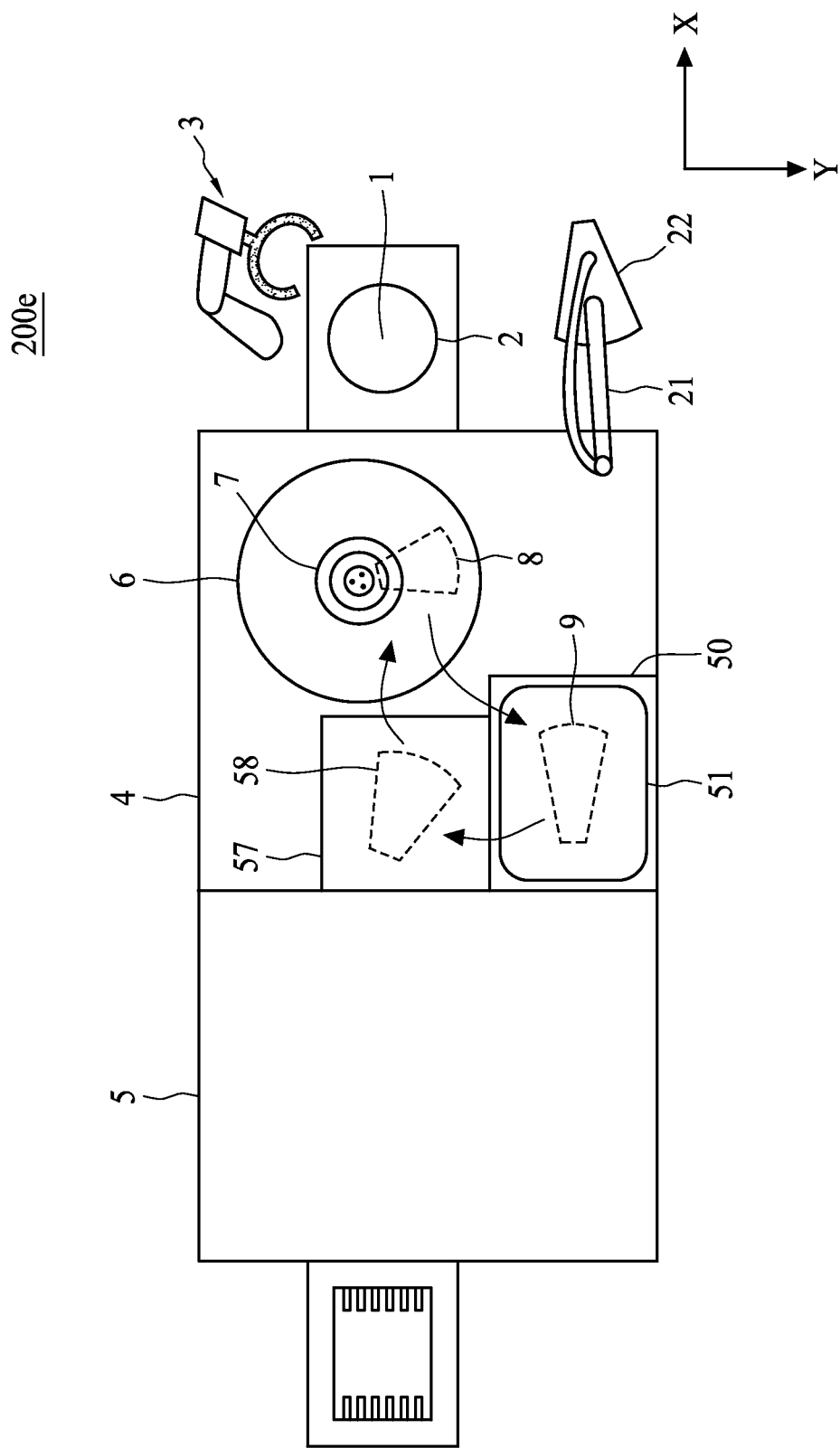
FIG. 22 is a schematic view of a semiconductor wafer cleaning system for cleaning a plate designed for several modes corresponding to different positions.

In FIG. 22, the loader 3 of the semiconductor wafer cleaning system 200e passes the semiconductor wafer 2 to the cup 6 and the wafer chuck 7 holds the semiconductor wafer 2 in the chamber 4. The arm 21 moves the plate 22 to position 8 to clean the top surface 1 of the wafer 2 in the first mode. After the first mode, the plate 22 is moved to position 9 so as to perform the second mode. In the second mode, the plate 22 is cleaned in the container 51 of the clean unit 50. At position 9, the particles trapped in the plate 22 are detached by the particle removal component. Finally, the plate 22 is moved from position 9 to position 58, where the plate 22 is located in the IPA tank 57 and dehydrated in the third mode.

In some embodiments, the semiconductor wafer cleaning system 200e drives the arm 21 to pivot the plate 22 above a semiconductor wafer 2 in the first mode. The power of the ultrasonic wave is applied to the plate 22, which generates ultrasonic waves working as brushes for cleaning the top surface 1.

Figure 23:
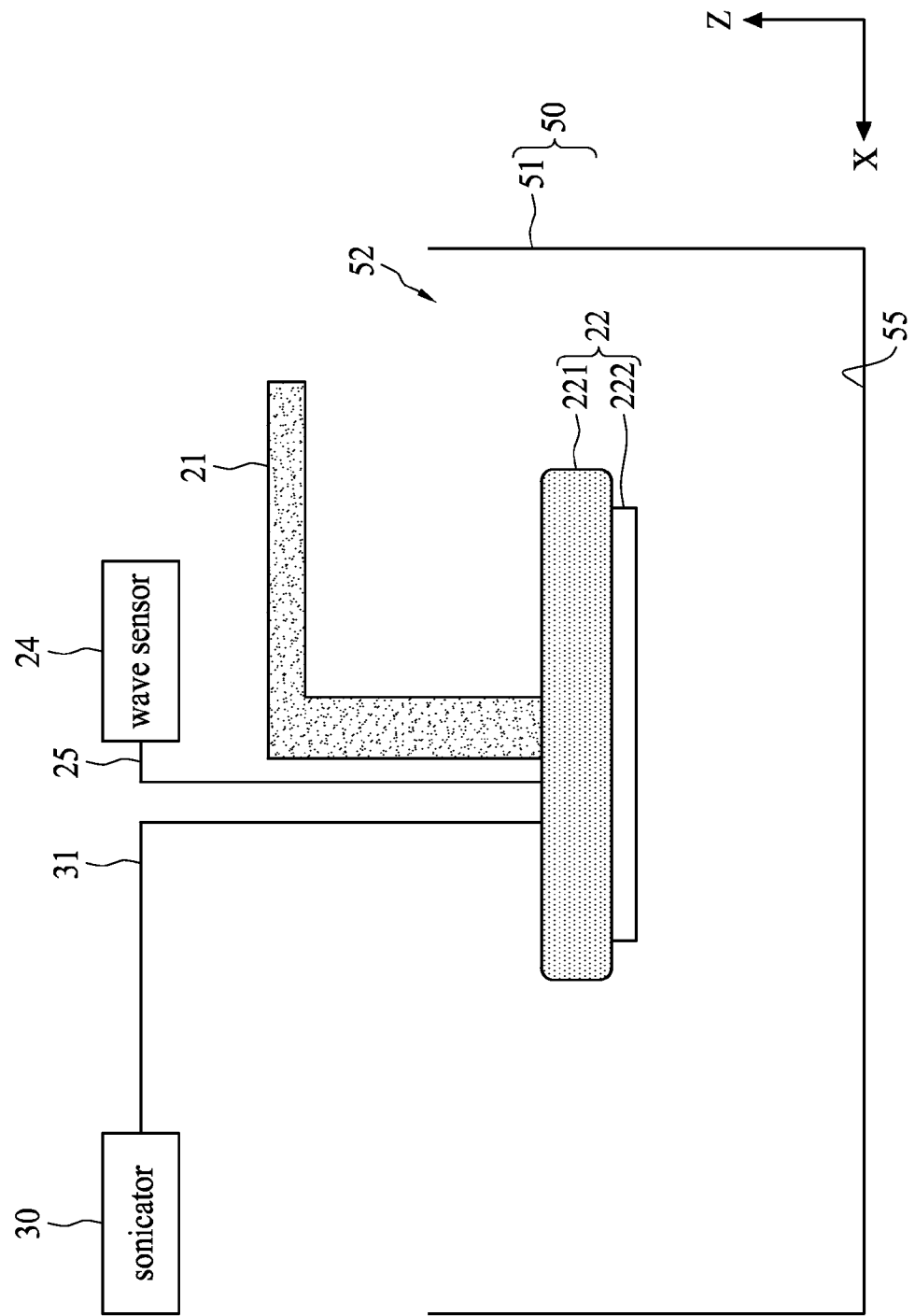
FIG. 23 is a schematic view of an operation of moving the plate to a container.

FIG. 23 is corresponding to the operation 302 in FIG. 21. In the second mode as in FIG. 23, the semiconductor wafer cleaning system 200e operates the arm 21 to place the plate 22 in the container 51 of the clean unit 50. The plate 22 is disposed parallel to the bottom surface 55 of the container 51. The wave sensor 24 is coupled to the plate 22 through the electric wire 25. The sonicator 30 is coupled to the plate 22 through the wire 31. Thus, the wire 31 and the electric wire 25 are placed into the container 51 after the operation 302 is performed.

Figure 24:
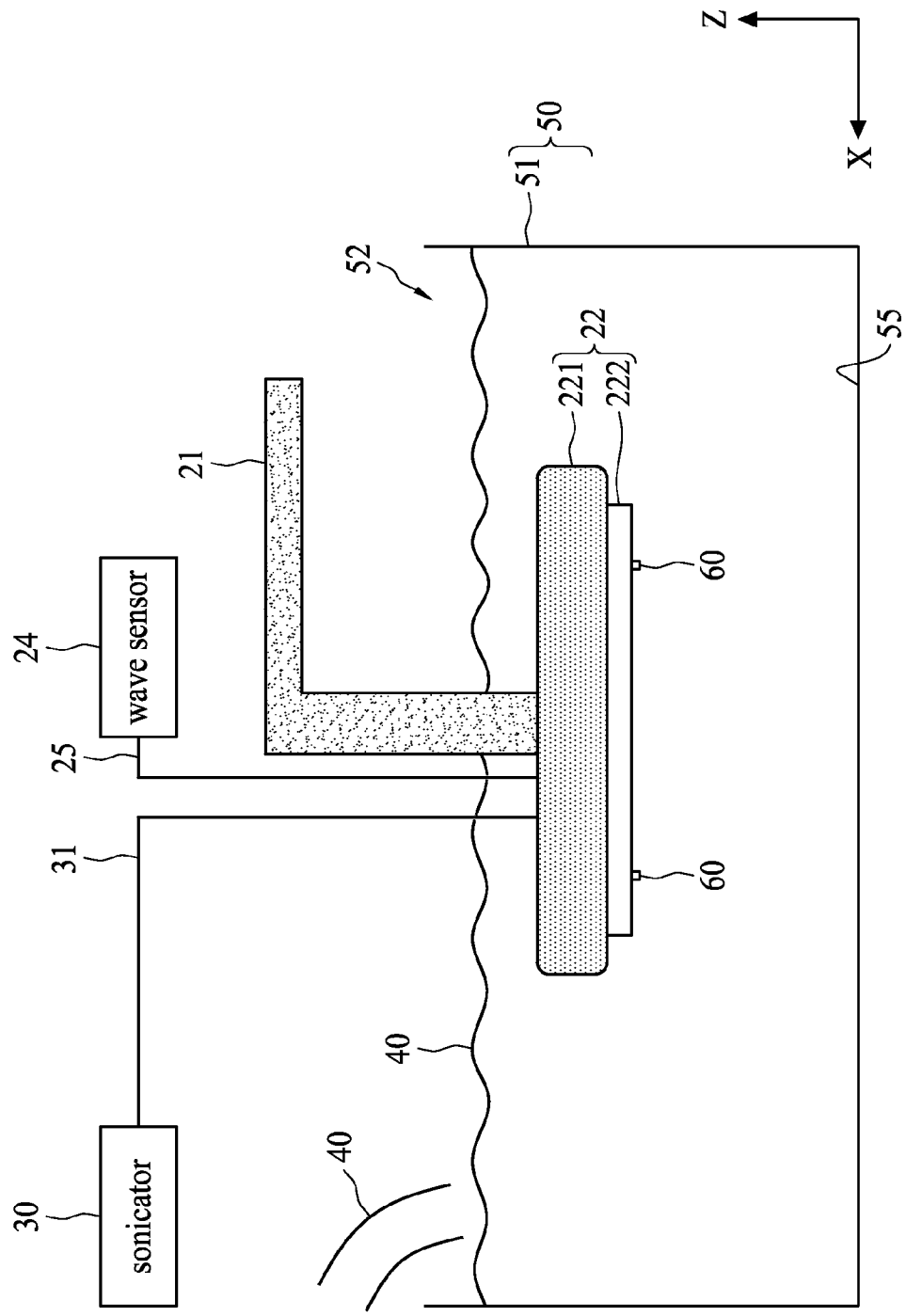
FIG. 24 is a schematic view of an operation of immersing the plate into a liquid.

FIG. 24 is corresponding to the operation 304 in FIG. 21. The plate 22 is immersed into the liquid 40. The liquid 40 flows into the container 51 through the opening 52. The liquid 40 is, but not limited, selected from a citric acid solution, a formic acid solution and an ammonia solution. The percentage of citric acid in the citric acid solution by mass is, but not limited, from about 0.2% to about 2%. In some embodiments, the percentage thereof is from about 0.1% to about 1.8%. In some other embodiments, the percentage thereof is from about 0.5% to about 2.1%. In addition, the percentage of ammonia in the ammonia solution by mass is, but not limited, from about 0.4% to about 4%. In some other embodiments, the percentage thereof is from about 0.9% to about 1.8%. In certain embodiments, the percentage thereof is from about 2.1% to about 3.5%.

In some embodiments, swiveling the second layer 222 along X or Y direction in the container 51 agitates the turbulence of the liquid 40 around the plate 22 so as to efficiently clean the plate 22. In certain embodiments, an operation of scrubbing the surface of the plate 22 by the mechanical cleaning force is performed to clean the plate 22 in the liquid 40, which is used to carry the particles from the plate 22.

Figure 25:
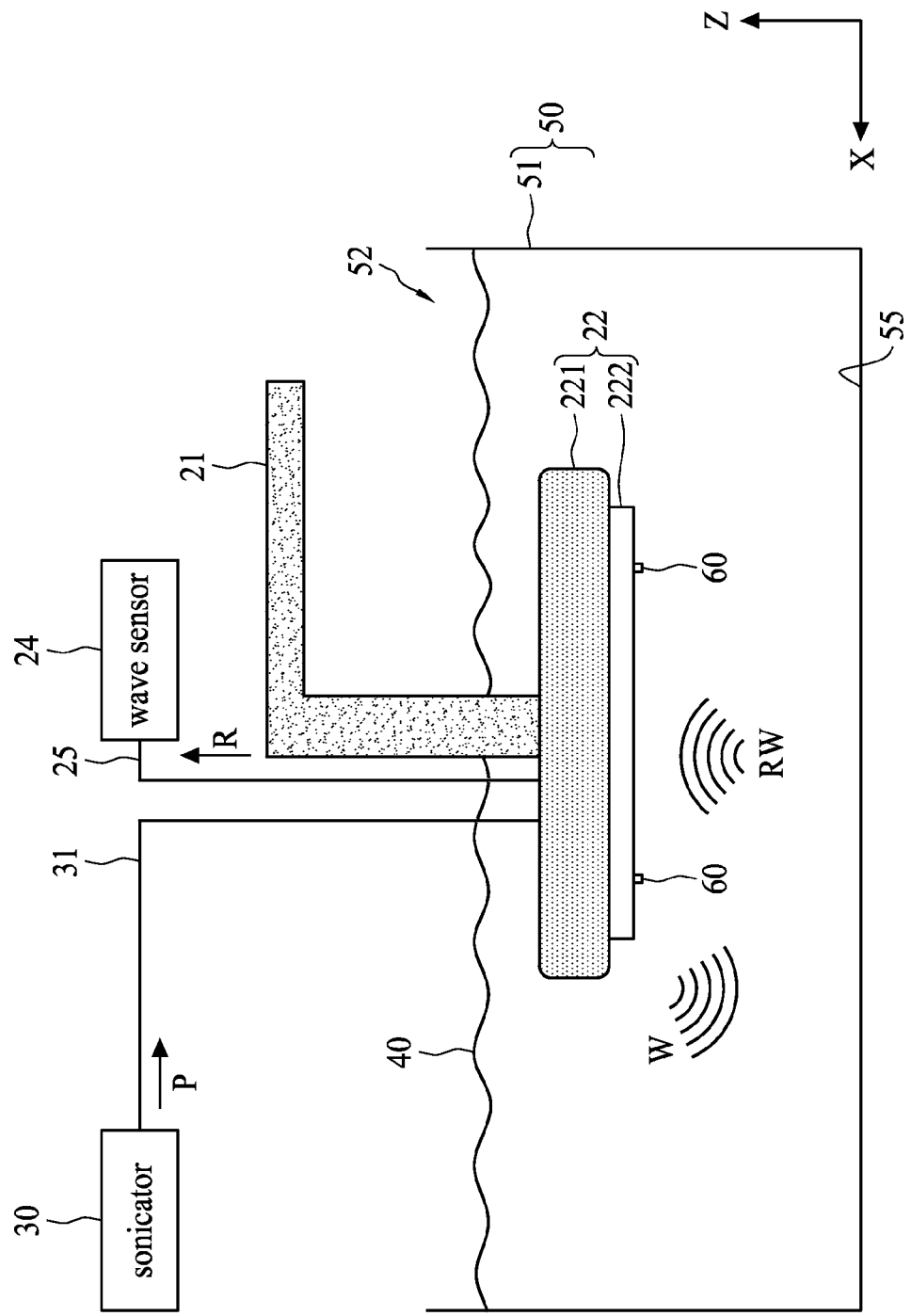
FIG. 25 is a schematic view of an operation of applying a power of an ultrasonic wave on the plate.

FIG. 25 is corresponding to the operation 306 in FIG. 21 that a power P of an ultrasonic wave W is applied on the plate 22. In some embodiments, the sonicator 30 applies the power P to the plate 22. Because the second layer 222 includes piezoelectric material, the power P is converted into a physical vibration, which causes the liquid 40 to generate the ultrasonic wave W around the second layer 222. The ultrasonic power is used to detach the particle 60 from the second layer 222.

In some embodiments, the ultrasonic wave W is reflected from the bottom surface 55 so as to form a reflected ultrasonic wave RW. The second layer 222 senses the reflected ultrasonic wave RW and generates the reflected signal R. In other words, the method 300 includes an operation of sensing a reflected ultrasonic wave RW, which is reflected from the container 51.

Figure 26:
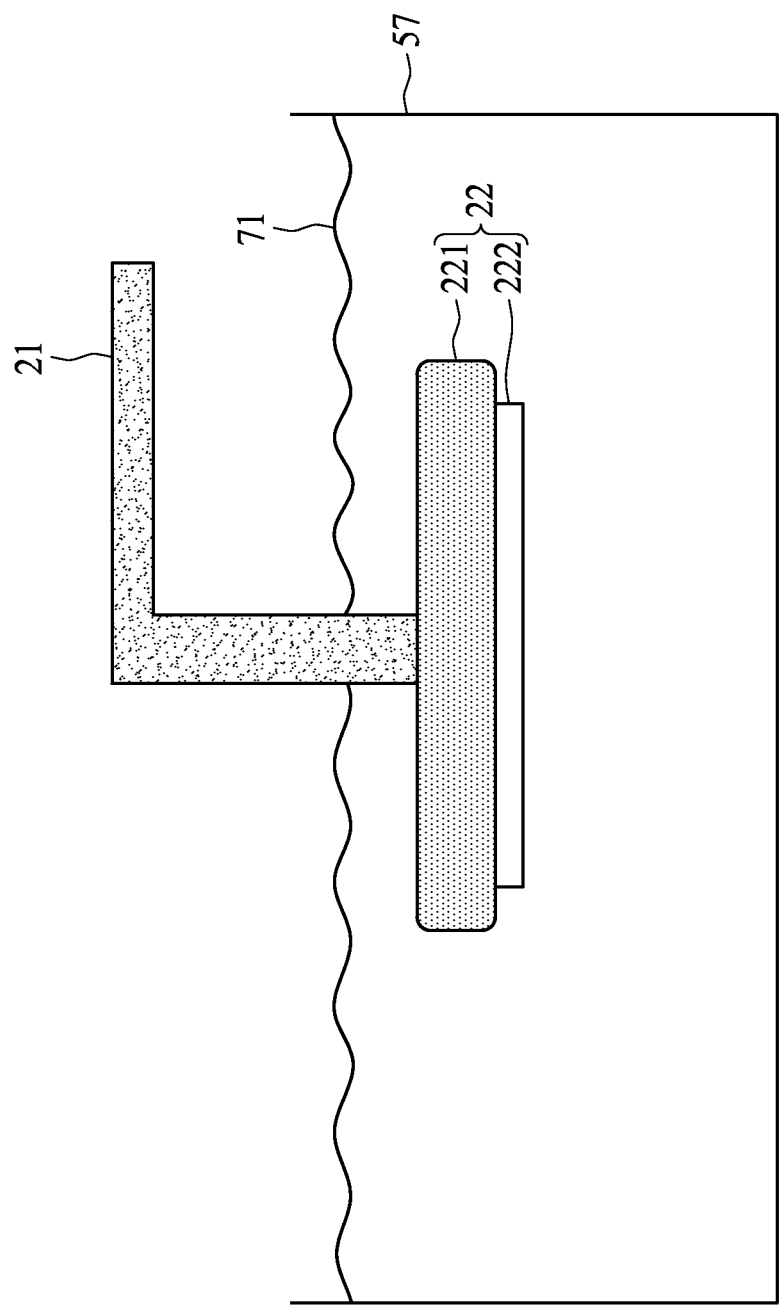
FIG. 26 is a schematic view of an operation of dehydrating the plate.

FIG. 26 is corresponding to the operation 308 in FIG. 21. The plate 22 is immersed into the isopropyl alcohol 71 so as to remove the water molecule attached to the plate 22.

In some embodiments, the IPA tank 57 is filled with a non-polar solvent selected from pentane, hexane, cyclohexane, benzene, toluene, chloroform, and diethyl ether. The non-polar solvent is used to replace the wafer molecule around the plate 22 and easily evaporates when the plate 22 is disposed above the non-polar solvent. In some other embodiments, the dehydrating operation 308 is implemented in the container 51. The container 51 accommodates the non-polar solvent selected from isopropyl alcohol, pentane, hexane, cyclohexane, benzene, toluene, chloroform, and diethyl ether. The non-polar solvent is able to generate the ultrasonic wave or the stream of flow for cleaning the plate 22 and to dehydrate the plate 22 at the same time.

In some embodiments, an apparatus for cleaning a plate designed for cleaning a wafer surface includes a container, an exit, and a sonicator. The container includes an opening and a bottom surface. The opening is configured to receive the plate and the bottom surface, which is under the plate during a predetermined mode. The exit is disposed in the container. The sonicator is coupled to the container and applies an ultrasonic wave on the plate during the predetermined mode.

In some embodiments, a semiconductor wafer cleaning system includes a plate, an arm, a sonicator and a clean unit. The plate is configured to clean a wafer during a run mode. The arm is pivoted to the plate and controls the position of the plate. The sonicator is coupled to the plate. The clean unit is configured to receive the plate during a self-clean mode.

In some embodiments, a method for cleaning a plate designed for cleaning a wafer surface includes moving the plate to a container. The method also includes immersing the plate into a liquid. The method also includes applying a power of an ultrasonic wave on the plate. The method also includes dehydrating the plate.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein. It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments.

Further, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel.

As used in this application, "or" is intended to mean an inclusive "or" rather than an exclusive "or". In addition, "a" and "an" as used in this application are generally to be construed to mean "one or more" unless specified otherwise or clear from context to be directed to a singular form. Furthermore, to the extent that "includes", "having", "has", "with", or variants thereof are used in either the detailed description or the claims, such terms are intended to be inclusive in a manner similar to "comprising".

What is claimed is:

1. A semiconductor wafer cleaning system, comprising:
a plate configured to clean a wafer during a run mode;
an arm pivoted to the plate and controlling the position of the plate;
a sonicator coupled to the plate; and
a clean unit configured to receive the plate during a self-clean mode;
wherein the plate includes a first layer and a second layer, and
the first layer includes:
a flat region, being flat, the flat region being parallel to the second layer, the flat region including a first hole as a liquid inlet and a second hole as a liquid outlet; and
a binding region, disposed at an edge of one side of the flat region, the binding region being protruding from the flat region, the binding region being arranged to bind the second layer; and the second layer includes a through hole guiding the liquid from the first hole to a top surface of the wafer.

2. The semiconductor wafer cleaning system of claim 1, wherein the plate includes a plurality of pores.

3. The semiconductor wafer cleaning system of claim 1, wherein the plate is in a pie shape.

4. The semiconductor wafer cleaning system of claim 1, wherein the clean unit further includes a particle removal component.

5. The semiconductor wafer cleaning system of claim 1, further comprising a wave sensor coupled to the plate configured to receive a reflected ultrasonic wave from the clean unit.

6. The semiconductor wafer cleaning system of claim 1, wherein the wave reflector is separated from a surface of the plate with a distance between about 1 mm and about 4 mm.

7. The semiconductor wafer cleaning system of claim 1, further comprising an IPA tank.

8. A semiconductor wafer cleaning system for cleaning a semiconductor wafer, wherein the semiconductor wafer cleaning system has a first mode and a second mode, the semiconductor wafer cleaning system comprising:
a cup configured to accommodate the semiconductor wafer and draining a liquid for cleaning the semiconductor wafer;
a plate configured to clean the semiconductor wafer in the cup during the first mode;
an arm configured to be pivoted to the plate and controlling the position of the plate;
a clean unit configured to receive the plate in the second mode for cleaning the plate; and
a sonicator configured to generate an ultrasonic wave to the plate;
wherein the plate includes a first layer and a second layer, and
the first layer includes:
a flat region, being flat, the flat region being distanced from the second layer and parallel to the second layer, the flat region including a first hole as a liquid inlet and a second hole as a liquid outlet; and
a binding region, disposed at an edge of one side of the flat region, the binding region being protruding from the flat region, the binding region being arranged to bind the second layer; and
the second layer includes a through hole guiding the liquid from the first hole to a top surface of the semiconductor wafer.

9. The semiconductor wafer cleaning system of claim 8, wherein the second layer includes a piezoelectric material.

10. The semiconductor wafer cleaning system of claim 8, wherein the arm is configured to conduct a three-dimensional motion.

11. The semiconductor wafer cleaning system of claim 8, wherein the sonicator generates a signal to the plate.

12. The semiconductor wafer cleaning system of claim 11, wherein the signal is configured to generate the ultrasonic wave.

13. The semiconductor wafer cleaning system of claim 12, further comprising a wave sensor coupled to the sonicator, wherein the wave sensor is used for calibrating the power of the signal generated by the sonicator.

14. The semiconductor wafer cleaning system of claim 8, further comprising a wave reflector for reflecting the ultrasonic wave.

15. A semiconductor wafer cleaning system for cleaning a semiconductor wafer, comprising:
a cup configured to accommodate the semiconductor wafer;
a plate configured to clean the semiconductor wafer in the cup;
an arm configured to be pivoted to the plate and controlling the position of the plate;
a clean unit configured to receive the plate for cleaning the plate; and
a dehydration device for dehydrating the plate;
wherein the plate includes a first layer and a second layer, and
the first layer includes:
a flat region, being flat, the flat region being distanced from the second layer and parallel to the second layer, the flat region including a first hole as a liquid inlet and a second hole as a liquid outlet; and
a binding region, disposed at an edge of one side of the flat region, the binding region being protruding from the flat region, the binding region being arranged to bind the second layer; and
the second layer includes a through hole guiding the liquid from the first hole to a top surface of the semiconductor wafer.

16. The semiconductor wafer cleaning system of claim 15, wherein the dehydration device includes an IPA tank.

17. The semiconductor wafer cleaning system of claim 15, wherein the dehydration device includes a heating element.

* * * * *